(12) United States Patent
Spengler et al.

(10) Patent No.: US 12,481,214 B2
(45) Date of Patent: Nov. 25, 2025

(54) CORRECTION OF BLUR VARIATION IN A MULTI-BEAM WRITER

(71) Applicant: IMS Nanofabrication GmbH, Vienna (AT)

(72) Inventors: Christoph Spengler, Vienna (AT); Wolf Naetar, Vienna (AT); Johannes Leitner, Vienna (AT)

(73) Assignee: IMS Nanofabrication GmbH, Brunn am Gebirge (AT)

( * ) Notice: Subject to any disclaimer, the term of this patent is extended or adjusted under 35 U.S.C. 154(b) by 380 days.

(21) Appl. No.: 17/166,812

(22) Filed: Feb. 3, 2021

(65) Prior Publication Data

US 2021/0240074 A1  Aug. 5, 2021

(30) Foreign Application Priority Data

Feb. 3, 2020 (EP) ..................................... 20155217

(51) Int. Cl.
    *G03F 1/74* (2012.01)
    *G03F 1/70* (2012.01)
    *G03F 7/00* (2006.01)

(52) U.S. Cl.
    CPC .................. *G03F 1/74* (2013.01); *G03F 1/70* (2013.01); *G03F 7/70516* (2013.01)

(58) Field of Classification Search
    CPC .......... G03F 1/74; G03F 1/70; G03F 7/70516; H01J 37/3177
    See application file for complete search history.

(56) References Cited

U.S. PATENT DOCUMENTS

| 1,033,741 A | 7/1912 | Sims |
| 1,420,104 A | 6/1922 | Howe et al. |

(Continued)

FOREIGN PATENT DOCUMENTS

| CN | 202204836 U | 4/2012 |
| DE | 869995 C | 3/1953 |

(Continued)

OTHER PUBLICATIONS

European Search Report for Application 08450077.6, report dated Jan. 29, 2010, 2 pgs.

(Continued)

*Primary Examiner* — Jonathan Johnson
*Assistant Examiner* — Jayson D Cosgrove
(74) *Attorney, Agent, or Firm* — KPPB LLP

(57) ABSTRACT

In order to compensate for undesired effects of varying elevation of a target with respect to a nominal target plane, during writing a desired pattern on the target in a charged-particle beam apparatus, the pattern is re-calculated in each of a number of segments of the target plane by: determining an elevation of the target in the segment from the nominal target plane; determining a local blur value which represents the actual value of blur corresponding to the elevation, with regard to a dependence of the blur upon the elevation of the target; calculating a convolution kernel which represents a point spreading function realizing a local blur value; and re-calculating a nominal exposure pattern by applying the kernel to the pattern. The convolution kernel corresponds to introducing an additional blur into the pattern in the segment, increasing the blur to a given target blur value which is uniform to all segments.

20 Claims, 19 Drawing Sheets

(56) References Cited

U.S. PATENT DOCUMENTS

| | | |
|---|---|---|
| 1,903,005 A | 3/1933 | McCuen |
| 2,187,427 A | 1/1940 | Middleton |
| 2,369,796 A | 2/1945 | Ramberg |
| 2,714,678 A | 8/1955 | Otto |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith |
| 4,735,881 A | 4/1988 | Kobayashi et al. |
| 4,899,060 A | 2/1990 | Lischke |
| 5,103,101 A | 4/1992 | Berglund et al. |
| 5,260,579 A | 11/1993 | Yasuda et al. |
| 5,369,282 A | 11/1994 | Arai et al. |
| 5,399,872 A | 3/1995 | Yasuda et al. |
| 5,814,423 A | 9/1998 | Maruyama et al. |
| 5,841,145 A | 11/1998 | Satoh et al. |
| 5,847,959 A | 12/1998 | Veneklasen et al. |
| 5,857,815 A | 1/1999 | Bailey et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,111,932 A | 8/2000 | Dinsmore |
| 6,137,113 A | 10/2000 | Muraki |
| 6,140,644 A * | 10/2000 | Kawanami ............ G01N 23/00 |
| | | 250/397 |
| 6,225,637 B1 | 5/2001 | Terashima et al. |
| 6,229,595 B1 | 5/2001 | McKinley |
| 6,252,339 B1 | 6/2001 | Kendall |
| 6,258,511 B1 | 7/2001 | Okino et al. |
| 6,280,798 B1 | 8/2001 | Ring et al. |
| 6,333,138 B1 | 12/2001 | Higashikawa et al. |
| 6,443,699 B1 | 9/2002 | Mashey |
| 6,472,673 B1 | 10/2002 | Chalupka et al. |
| 6,473,237 B2 | 10/2002 | Mei |
| 6,552,353 B1 | 4/2003 | Muraki et al. |
| 6,617,587 B2 | 9/2003 | Parker |
| 6,768,123 B2 | 7/2004 | Giering |
| 6,768,125 B2 | 7/2004 | Platzgummer et al. |
| 6,829,054 B2 | 12/2004 | Stanke et al. |
| 6,835,937 B1 | 12/2004 | Muraki et al. |
| 6,858,118 B2 | 2/2005 | Platzgummer et al. |
| 6,897,454 B2 | 5/2005 | Sasaki et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson |
| 7,214,951 B2 | 5/2007 | Stengl et al. |
| 7,276,714 B2 | 10/2007 | Platzgummer et al. |
| 7,368,738 B2 | 5/2008 | Platzgummer et al. |
| 7,446,601 B2 | 11/2008 | LeChevalier |
| 7,459,247 B2 | 12/2008 | Bijnen et al. |
| 7,671,687 B2 | 3/2010 | LeChevalier |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,741,620 B2 | 6/2010 | Doering et al. |
| 7,772,574 B2 | 8/2010 | Stengl et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Heinrich et al. |
| 8,115,183 B2 | 2/2012 | Platzgummer et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,257,888 B2 | 9/2012 | Sczyrba et al. |
| 8,258,488 B2 | 9/2012 | Platzgummer et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,502,174 B2 | 8/2013 | Wieland |
| 8,531,648 B2 | 9/2013 | Jager et al. |
| 8,546,767 B2 | 10/2013 | Platzgummer et al. |
| 8,563,942 B2 | 10/2013 | Platzgummer |
| 8,598,544 B2 | 12/2013 | Van De Peut et al. |
| 9,053,906 B2 | 6/2015 | Platzgummer |
| 9,093,201 B2 | 7/2015 | Platzgummer et al. |
| 9,099,277 B2 | 8/2015 | Platzgummer |
| 9,165,745 B2 | 10/2015 | Luo |
| 9,188,874 B1 | 11/2015 | Johnson |
| 9,269,543 B2 | 2/2016 | Reiter et al. |
| 9,335,638 B2 | 5/2016 | Jager et al. |
| 9,373,482 B2 | 6/2016 | Platzgummer |
| 9,443,699 B2 | 9/2016 | Platzgummer et al. |
| 9,495,499 B2 | 11/2016 | Platzgummer et al. |
| 9,520,268 B2 | 12/2016 | Platzgummer |
| 9,568,907 B2 | 2/2017 | Platzgummer et al. |
| 9,653,263 B2 | 5/2017 | Platzgummer et al. |
| 9,799,487 B2 | 10/2017 | Platzgummer |
| 10,325,757 B2 | 6/2019 | Platzgummer et al. |
| 10,483,080 B1 | 11/2019 | Cook et al. |
| 12,040,157 B2 | 7/2024 | Platzgummer et al. |
| 12,154,756 B2 | 11/2024 | Platzgummer et al. |
| 2001/0028038 A1 | 10/2001 | Hamaguchi et al. |
| 2002/0000524 A1* | 1/2002 | Suzuki ............... B82Y 10/00 |
| | | 250/492.21 |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0139054 A1* | 7/2003 | Fujimoto ................ G03F 1/30 |
| | | 430/394 |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0135102 A1 | 7/2004 | Muraki et al. |
| 2004/0157407 A1 | 8/2004 | Qin-Yi et al. |
| 2004/0169147 A1 | 9/2004 | Ono et al. |
| 2005/0063510 A1 | 3/2005 | Hieronimi et al. |
| 2005/0072941 A1 | 4/2005 | Tanimoto et al. |
| 2005/0104013 A1 | 5/2005 | Stengl et al. |
| 2005/0214657 A1* | 9/2005 | Mitsui ................ G03F 1/24 |
| | | 430/21 |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0057204 A1 | 3/2007 | Kruit et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1 | 6/2008 | Doering et al. |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0237460 A1 | 10/2008 | Fragner et al. |
| 2008/0257096 A1 | 10/2008 | Zhu et al. |
| 2008/0260283 A1 | 10/2008 | Ivansen |
| 2008/0266413 A1* | 10/2008 | Cohen ................. G06T 5/94 |
| | | 348/222.1 |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0114818 A1 | 5/2009 | Casares et al. |
| 2009/0200495 A1 | 8/2009 | Platzgummer et al. |
| 2009/0212229 A1 | 8/2009 | Wieland et al. |
| 2009/0256075 A1 | 10/2009 | Kemen et al. |
| 2009/0321631 A1 | 12/2009 | Smick et al. |
| 2010/0127185 A1 | 5/2010 | Fragner et al. |
| 2010/0127431 A1 | 5/2010 | Sandstrom |
| 2010/0178602 A1 | 7/2010 | Seto et al. |
| 2010/0187434 A1 | 7/2010 | Platzgummer et al. |

(56) References Cited

U.S. PATENT DOCUMENTS

| | | |
|---|---|---|
| 2010/0224790 A1 | 9/2010 | Platzgummer et al. |
| 2010/0288938 A1 | 11/2010 | Platzgummer |
| 2011/0049393 A1 | 3/2011 | De Boer et al. |
| 2011/0053087 A1 | 3/2011 | Nielsen et al. |
| 2011/0073782 A1 | 3/2011 | Wieland |
| 2011/0121208 A1 | 5/2011 | Nakayamada et al. |
| 2011/0204253 A1 | 8/2011 | Platzgummer et al. |
| 2011/0226968 A1 | 9/2011 | Platzgummer |
| 2012/0007002 A1 | 1/2012 | Nakayamada et al. |
| 2012/0076269 A1 | 3/2012 | Roberts et al. |
| 2012/0085940 A1 | 4/2012 | Matsumoto |
| 2012/0091318 A1 | 4/2012 | Wieland et al. |
| 2012/0211674 A1 | 8/2012 | Kato |
| 2012/0286169 A1 | 11/2012 | Van de Peut et al. |
| 2012/0286170 A1 | 11/2012 | Van de Peut et al. |
| 2012/0286173 A1 | 11/2012 | Van de Peut et al. |
| 2012/0288787 A1 | 11/2012 | Choi et al. |
| 2013/0128247 A1 | 5/2013 | Khuat et al. |
| 2013/0157198 A1 | 6/2013 | Yoshikawa et al. |
| 2013/0164684 A1 | 6/2013 | Yamanaka |
| 2013/0198697 A1 | 8/2013 | Hotzel et al. |
| 2013/0252145 A1 | 9/2013 | Matsumoto et al. |
| 2013/0253688 A1 | 9/2013 | Matsumoto et al. |
| 2014/0042334 A1 | 2/2014 | Wieland |
| 2014/0061499 A1 | 3/2014 | Ogasawara et al. |
| 2014/0168629 A1 | 6/2014 | Nishida et al. |
| 2014/0197327 A1 | 7/2014 | Platzgummer |
| 2014/0240732 A1 | 8/2014 | Tinnemans et al. |
| 2014/0264085 A1 | 9/2014 | Van de Peut et al. |
| 2014/0322927 A1 | 10/2014 | Morita |
| 2014/0346369 A1 | 11/2014 | Matsumoto |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0243480 A1 | 8/2015 | Yamada |
| 2015/0248993 A1 | 9/2015 | Reiter et al. |
| 2015/0311030 A1 | 10/2015 | Platzgummer et al. |
| 2015/0311031 A1 | 10/2015 | Platzgummer et al. |
| 2015/0347660 A1 | 12/2015 | Platzgummer et al. |
| 2015/0357157 A1 | 12/2015 | Mueller |
| 2016/0012170 A1 | 1/2016 | Platzgummer |
| 2016/0013019 A1* | 1/2016 | Platzgummer ........ G06F 30/392 250/492.22 |
| 2016/0071684 A1 | 3/2016 | Platzgummer et al. |
| 2016/0276131 A1 | 9/2016 | Platzgummer |
| 2016/0276132 A1 | 9/2016 | Platzgummer et al. |
| 2016/0336147 A1 | 11/2016 | Platzgummer |
| 2017/0294287 A1 | 10/2017 | Knippelmeyer et al. |
| 2017/0357153 A1* | 12/2017 | Platzgummer ............ G03F 1/78 |
| 2019/0198293 A1* | 6/2019 | Ogasawara ......... H01J 37/3177 |
| 2020/0051261 A1* | 2/2020 | Tsuruyama .......... G01B 11/026 |
| 2020/0312619 A1 | 10/2020 | Mangnus et al. |
| 2022/0246388 A1 | 8/2022 | Rauwolf et al. |
| 2022/0384143 A1 | 12/2022 | Platzgummer et al. |
| 2023/0360878 A1 | 11/2023 | Puchberger et al. |
| 2023/0360880 A1 | 11/2023 | Eder-kapl et al. |
| 2024/0304415 A1 | 9/2024 | Spengler et al. |

FOREIGN PATENT DOCUMENTS

| | | |
|---|---|---|
| DE | 892036 C | 10/1953 |
| DE | 893107 C | 10/1953 |
| DE | 1035813 B | 8/1958 |
| EP | 0178156 A2 | 4/1986 |
| EP | 1033741 A2 | 9/2000 |
| EP | 1993118 A2 | 11/2008 |
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| EP | 2950325 A1 | 12/2015 |
| EP | 2993684 A1 | 3/2016 |
| GB | 689527 A | 4/1953 |
| GB | 2349737 A | 11/2000 |
| JP | 08213301 A | 8/1996 |
| JP | 2006019436 A | 1/2006 |
| JP | 2006332289 | 12/2006 |
| WO | 2006053358 A1 | 5/2006 |
| WO | 2006084298 A1 | 8/2006 |
| WO | 2008053140 A1 | 5/2008 |
| WO | 2009147202 | 12/2009 |
| WO | 2012041464 A1 | 4/2012 |
| WO | 2012172913 A1 | 12/2012 |
| WO | 2022248196 A1 | 12/2022 |

OTHER PUBLICATIONS

European Search Report for Application 09450211.9-1226; report dated Sep. 14, 2010; 4 pgs.
European Search Report for application 09450212.7; dated Sep. 28, 2010, 9 pgs.
European Search Report for Application 14150119.7, report dated Jun. 6, 2014, 2 pgs.
European Search Report for Application 14165967, report dated Oct. 30, 2014, 2 pgs.
European Search Report for Application 14165970, report dated Jun. 18, 2014, 2 pgs.
European Search Report for Application 14170611, report dated Nov. 4, 2014, 3 pgs.
European Search Report for Application 14176563, report dated Jan. 14, 2015, 2 pgs.
European Search Report for Application 14177851; report dated Oct. 16, 2014; 1 page.
European Search Report for Application 14199183, report dated Jun. 19, 2015, 2 pgs.
European Search Report for Application 15159397.7, report dated Sep. 28, 2015, 7 pgs.
European Search Report for Application 15159617.8, report dated Oct. 19, 2015, 3 pgs.
European Search Report for Application 15164770, report dated Sep. 18, 2015; 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for EP 14176645, completed Dec. 1, 2014, 1 pg.
European Search Report for EP Application No. 16174185, Search Completed Dec. 6, 2016, 2 pgs.
European Search Report for EP Application No. 20155217, Search completed Jul. 20, 2020, 1 pg.
European Search Report for European Application 10450070.7 dated May 7, 2012, 13 pgs.
European Search Report for European Application No. 16160622, Search completed Jul. 21, 2016, Mailed Jul. 21, 2016, 3 Pgs.
European Search Report for European Patent Application 16160621, Report Completed Oct. 5, 2016, 3 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, "EUV, EBDW—ARF Replacement or Extension?", KLA-Tencor Lithography User Forum, Feb. 21, 2010, San Jose, CA, USA, 21 pgs.
Borodovsky, "MPProcessing for MPProcessors", SEMATECH Maskless Lithography and Multibeam Mask Writer Workshop, May 10, 2010, New York, NY, USA, 35 pgs.
Disclosed Anonymously, "Multi-tone rasterization, dual pass scan, data path and cell based vector format", IPCOM000183472D, printed from ip.com PriorArtDatabase, published May 22, 2009, 108 pages.
Huber et al., "Computing Straight Skeletons and Motorcycle Graphs: Theory and Practice", Thesis, Univ. of Salzburg (Austria), Jun. 2011, 134 pgs.

(56) References Cited

OTHER PUBLICATIONS

Kapl et al., "Characterization of CMOS programmable multi-beam blanking arrays as used for programmable multi-beam projection lithography and resistless nanopatterning", Journal of Micromechanics and Microengineering, vol. 21, Mar. 24, 2011, pp. 1-8, doi:10.1088/0960-1317/21/4045038.

Li et al., "Through-Silicon Interposer Technology for Heterogeneous Integration", Future Fab Intl., Issue 45 (Apr. 25, 2013), 6 pgs.

Palfrader et al., "Computing Mitered Offset Curves Based on Straight Skeletons", Computer-Aided Design & Applications, vol. 12, No. 4, Feb. 11, 2015, pp. 414-424, http://dx.doi.org/10.1080/16864360.2014.997637.

Paraskevopoulos et al., "Scalable (24-140 Gbps) optical data link, well adapted for future maskless lithography applications", Proc. SPIE vol. 7271, 72711 I (2009), 11 pgs., doi: 10.1117/12.811495.

Platzgummer et al., "eMET—50keV electron Mask Exposure Tool Development based on proven multi-beam projection technology", Proc. of SPIE, 2010, vol. 7823, pp. 782308-1-782308-12, doi: 10.1117/12.811495.

Platzgummer et al., "eMET POC: Realization of a proof-of-concept 50 keV electron multibeam Mask Exposure Tool", Proc. of SPIE, 2011, vol. 8166, pp. 816622-1-816622-7, doi: 10.1117/12.895523.

Shih, "Image processing and mathematical morphology: fundamentals and applications", CRC Press, 2009, pp. 26-32.

Wheeler et al., "Use of Electron Beams in VLSI", G.E.C. Journal of Science and Technology, General Electric Company. Wembley, Middlesex, GB, vol. 48, No. 2, Jan. 1, 1982 (Jan. 1, 1982), pp. 103-107, XP000820522.

Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860, DOI: 10.1116/1.2366677.

Extended European Search Report for European Application No. 21175588.9, Search Completed Nov. 8, 2021, Mailed Nov. 16, 2021, 12 Pgs.

Extended European Search Report for European Application No. 22171589.9, Search completed Oct. 24, 2022, Mailed Nov. 7, 2022, 5 Pgs.

Extended European Search Report for European Application No. 22172309.1, Search completed Dec. 19, 2022, Mailed Jan. 3, 2023, 22 pgs.

Extended European Search Report for European Application No. 22189892.7, Search completed Feb. 20, 2023, Mailed Mar. 21, 2023, 10 Pgs.

Extended European Search Report for European Application No. 23160723.5, Search completed Aug. 21, 2023, Mailed Aug. 31, 2023, 11 Pgs.

Mueller, "Regelbare magnetostatische Linsensysteme fur Elektronenmikroskope—[Variable magnetostatic lens systems for electron microscopes]", Zeitschrift fur Wissenschaftliche Mikroskopie und Furmikroskopische Technik, Hirzel Verlag, Stuttgart, DE, May 31, 1957, vol. 63, No. 5, pp. 303-328, XP009521932.

\* cited by examiner

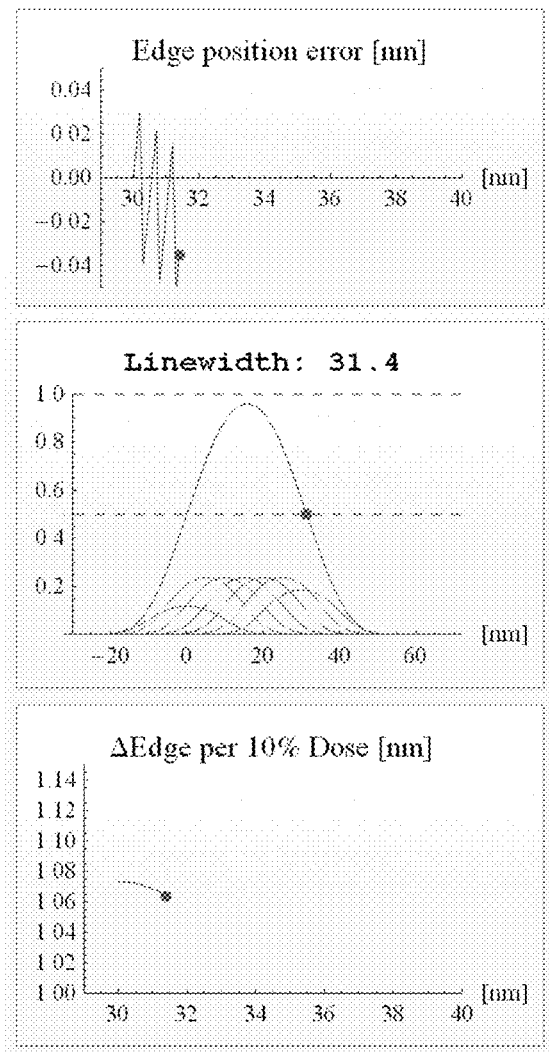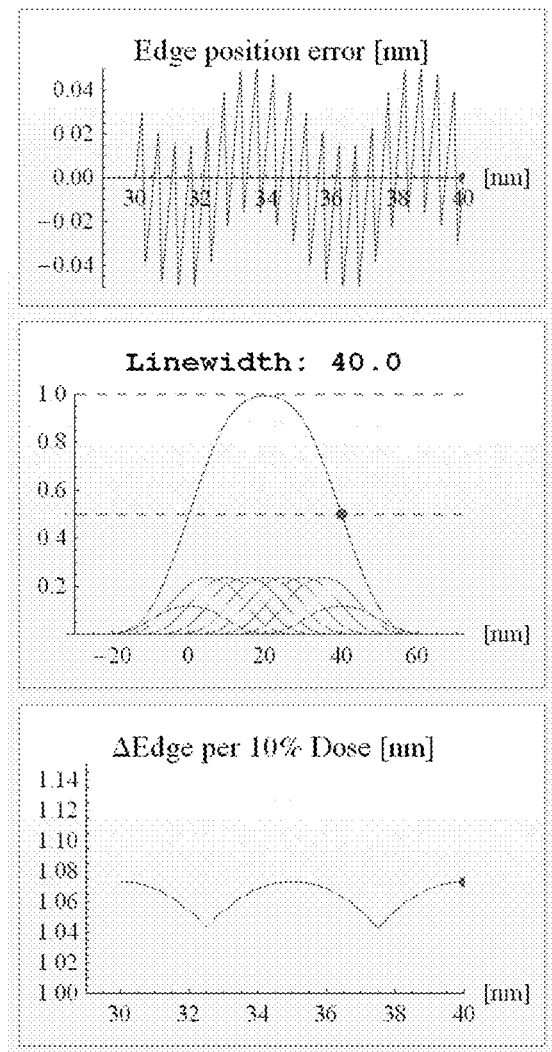
Fig. 4A Fig. 4B
Fig. 4 (prior art)

CORRECTION OF BLUR VARIATION IN A MULTI-BEAM WRITER

CROSS REFERENCE TO RELATED APPLICATIONS

This application claims priority to European Patent Application No. 20155217.1, entitled "Correction of Blur Variation in a Multi-Beam Writer" to Spengler et al., filed Feb. 3, 2020, the disclosures of which are incorporated by reference herein in their entirety.

Field of the Invention and Description of Prior Art

The invention relates to the field of charged-particle multi-beam processing apparatuses for the exposure of a target by means of a structured beam of electrically charged particles, and in particular to a method for computing an exposure pattern for exposing a desired pattern on a target in a charged-particle lithography apparatus. In such an apparatus a particle beam is generated in an illumination system, is directed to and illuminates a pattern definition device comprising an aperture array composed of a plurality of blanking apertures through which the particle beam penetrates and is then imaged by a projection optics system onto a target, for writing the desired pattern by exposing a multitude of pixels within an exposure area on the target, by means of the particle beam impinging on the target according to a nominal beam direction; whereas the target is oriented along a nominal target plane substantially perpendicular to the nominal beam direction. A writing process for writing such a desired pattern comprises imaging of the blanking apertures onto the target in each of a sequence of exposure intervals, which thus generates a corresponding plurality of aperture images; this imaging of blanking apertures onto the target involves a blur, as further explained below.

SUMMARY OF THE INVENTION

According to a first aspect of the invention, a method is proposed for computing an exposure pattern for exposing a desired pattern on a target in a charged-particle multi-beam processing apparatus, where the method takes into account an elevation of the target within the exposure area relative to the nominal target plane, as well as a dependence of the blur upon such elevation of the target according to an elevation dependence function; the desired pattern is provided as a graphical representation composed of a multitude of image elements in a correspondence to the multitude of pixels in the exposure area on the target, and in the pattern definition device the plurality of blanking apertures is arranged in a predetermined arrangement defining mutual positions of the blanking apertures. Each blanking aperture is selectively adjustable with regard to a dose value to be exposed through the respective blanking aperture onto a corresponding aperture image generated on the target during a respective exposure interval. The method for computing an exposure pattern according to this aspect of the invention comprises the following steps:

(i) determining an elevation of the target at a reference point (or several reference points) within the exposure area, the elevation representing a local shift of the target from the nominal target plane at the location of the reference point,
  (ii) determining, based on the elevation dependence function, a local blur value, which represents the actual value of blur corresponding to the elevation of the target determined in the previous step,
  (iii) determining, based on said local blur value and a given target blur level, an additional correction blur value and calculating a convolution kernel using the local blur value, which kernel describes a mapping from an image element of the graphical representation to a group of pixels, where a group of pixels is centered around a nominal position of the image element, and the kernel represents a point spreading function realizing the local blur value, and
  (iv) calculating a nominal exposure pattern as a pixel raster graphics defined on the multitude of pixels, by convolution of the graphical representation with the convolution kernel in the entire exposure region, or at least a region of the exposure area which includes said reference point ("correction region"), and the nominal exposure pattern thus obtained serves to create a nominal dose distribution on the target;

wherein the convolution calculated in the above steps corresponds to introducing a blur corresponding to the correction blur value into the nominal exposure pattern, where the additional correction blur increases the blur of the exposure pattern from the local blur value to the given target blur value.

This solution serves to compensate for the effects of variation of elevation over the target as mentioned above. The main idea of the invention is to raise the blur of the imaging system to a uniform value. Although this may decrease the resolution of the writing method to some extent, the uniform behavior of the blur contributes to a better characterization of the edge locations of the pattern written, in particular with regards to uniformity of critical dimension (CDU), a metric of critical importance in mask manufacturing.

In most cases of application, the method takes into account a spatial variation of the elevation of the target within the exposure area relative to the nominal target plane, employing a partitioning of the exposure area into a plurality of non-overlapping sub-regions, wherein steps (i) to (iv) are done for each of the sub-regions (also referred to as segments), wherein in step (i) for each sub-region a respective elevation of the target in a respective reference point of the sub-region is calculated, and steps (ii) to (iv) are done using a respective local blur value, and the target blur value is chosen as a value not below the maximum over the set of local blur values among all sub-regions, for instance the maximum value itself. For instance, the sub-regions may be realized as parallel stripes, each stripe having a longer side which is oriented substantially parallel to a general writing direction, said general writing direction representing a direction of lines along which subsequent exposures of pixels are performed during an exposure process in said charged-particle apparatus. Suitably, the longer side of the stripes may extend over a width of the particle beam where it impinges on the target, as measured along the general writing direction.

In a suitable implementation of the invention wherein the aperture array of the pattern definition device is imaged to the target producing a beam array field, at least some of the sub-regions may have a width smaller than a width of the image of the aperture array as imaged onto the target, said widths being measured across the general writing direction. For instance, the width of a sub-region may be the distance of aperture images on the target along a direction transversal to the general writing direction.

In many embodiments the calculation of blur is performed with respect to the two main axes of the nominal target plane, thus obtaining target blur values for each of said two main axes. This may be done by choosing, for each main axis, a target blur value as a value not below the maximum over the set of local blur values along the respective main axis among all sub-regions. In addition, it may be suitable to calculate an anisotropic kernel which corresponds to introducing a correction blur increasing the blur of the exposure pattern from the local blur value to a the target blur value for each of the two main axes separately. As an alternative or in combination, the anisotropic kernel may be calculated such that it corresponds to introducing a correction blur increasing the blur of the exposure pattern from the local blur value to the greater value of the two target blur values for the two main axes. Furthermore it may be useful to calculate an anisotropic kernel which contains correction components which enable correction of the blur of the exposure pattern to an isotropic blur; these correction components will often include off-diagonal correction components in the kernel.

An advantageous implementation of the kernel may be where the kernel describes the blur as a discretized realization of a two-dimensional Gaussian function.

In a suitable implementation of calculating the blur underlying the kernel, the kernel may correspond to, or include, the additional blur which is a sum including an elevation-dependent blur and a base blur, where the base blur is calculated as a function of the pattern density around the respective reference point.

Also, the kernel may correspond to, or include, an additional blur which is determined based on one or more environmental parameter of the processing apparatus, said environmental parameters including barometric pressure, temperatures of specific components of said processing apparatus, temperature at the location of the target, actual beam current of the particle beam.

For determining the effect of a set of candidate convolution kernels on the total blur of the exposure system it is, for instance, possible to proceed as follows: exposing test structures employing said candidate convolution kernels, which each are associated with individual kernel blur values, respectively, which extend over a predetermined value range; estimating the total blur from measurements of said test structures; and in step (iii) choosing a kernel blur value from the value range such that the total blur of the exposure system matches the target blur, when a correction kernel value of this kernel blur value is used.

Another aspect of the invention, proposes a method for writing an exposure pattern on a target in a charged-particle multi-beam processing apparatus. A particle beam is provided, directed to a pattern definition device comprising an aperture array composed of a plurality of blanking apertures through which said particle beam penetrates, thus forming a patterned beam consisting of a corresponding plurality of beamlets in accordance with said exposure pattern; the patterned beam exiting from the pattern definition device is directed towards an exposure area on the target for writing said desired pattern by exposing a multitude of pixels within said exposure area; furthermore, the exposure pattern is (re)calculated prior to exposure thereof on the target employing a method of the first aspect of the invention. In this context it may be suitable to have a surface metrology device in the apparatus for determining the elevation of at least one reference point on the target.

BRIEF DESCRIPTION OF THE DRAWINGS

In the following, the present invention is illustrated by several embodiments described below in more detail with reference to the attached drawings. It is emphasized that the embodiments shown here are of illustrative character and are not to be construed as limiting the scope of the invention. The drawings schematically show:

FIG. 3A shows a zero blur intensity profile for a line with 30 nm width, FIG. 3B indicates dose levels of overlapping exposure spots, FIG. 3C is a superposition of the previous two figures, and FIG. 3D shows a simulated intensity profile 66 for a line of 30 nm width;

FIG. 4 shows multi-beam writer intensity profiles and related data as obtained for simulations of lines with a line width of 31.4 nm (FIG. 4A) and 40.0 nm (FIG. 4B), respectively;

FIG. 11C shows the resulting discrete map, wherein the elevation values are indicated through the shade of the segment areas;

DETAILED DESCRIPTION OF EMBODIMENTS OF THE INVENTION

The detailed discussion given herein is intended to illustrate the invention and exemplary embodiments thereof, as well as further advantageous developments. It will be evident to the skilled person to freely combine several or all of the embodiments and aspects discussed here as deemed suitable for a specific application of the invention. Throughout this disclosure, terms like "advantageous", "exemplary" or "preferred" indicate elements or dimensions which are particularly suitable (but not essential) to the invention or an embodiment thereof, and may be modified wherever deemed suitable by the skilled person, except where expressly stated otherwise. It will be appreciated that the invention is not restricted to the exemplary embodiments discussed in the following, which are given for illustrative purpose and merely present suitable implementations of the invention.

Charged-particle multi-beam tools which are suitable for implementing the invention are described above with reference to FIGS. 1 to 5B. In particular, in the lithography apparatus 1 of FIG. 1, the calculation and correction methods described hereinafter may suitably be performed in the processing system 18 of the lithography apparatus and/or any other control system for processing the data and controlling the writing process. Further details about multi-beam charged-particle tools can be found in U.S. Pat. Nos. 9,520,268, 6,768,125, EP 2187427 A1 and EP 2 363 875 A1 and references cited therein, which are all herewith included by reference as part of the disclosure.

The applicant has realized charged-particle multi-beam tools of the mentioned type and developed corresponding charged-particle optics, pattern definition (PD) device, and multi-beam writing method, in particular a 50 keV electron multi-beam writer to realize leading-edge complex photomasks for 193 nm immersion lithography, of masks for EUV lithography and of templates (1× masks) for imprint lithography. The system is called eMET (electron Mask Exposure Tool) or MBMW (multi-beam mask writer) for exposing 6" mask blank substrates. The multi-beam system has been called PML2 (Projection Mask-Less Lithography) for electron beam direct writer (EBDW) applications on Silicon wafer substrates. The multi-beam column and writing method can also be used for multi-beam inspection applications.

Figure 1:
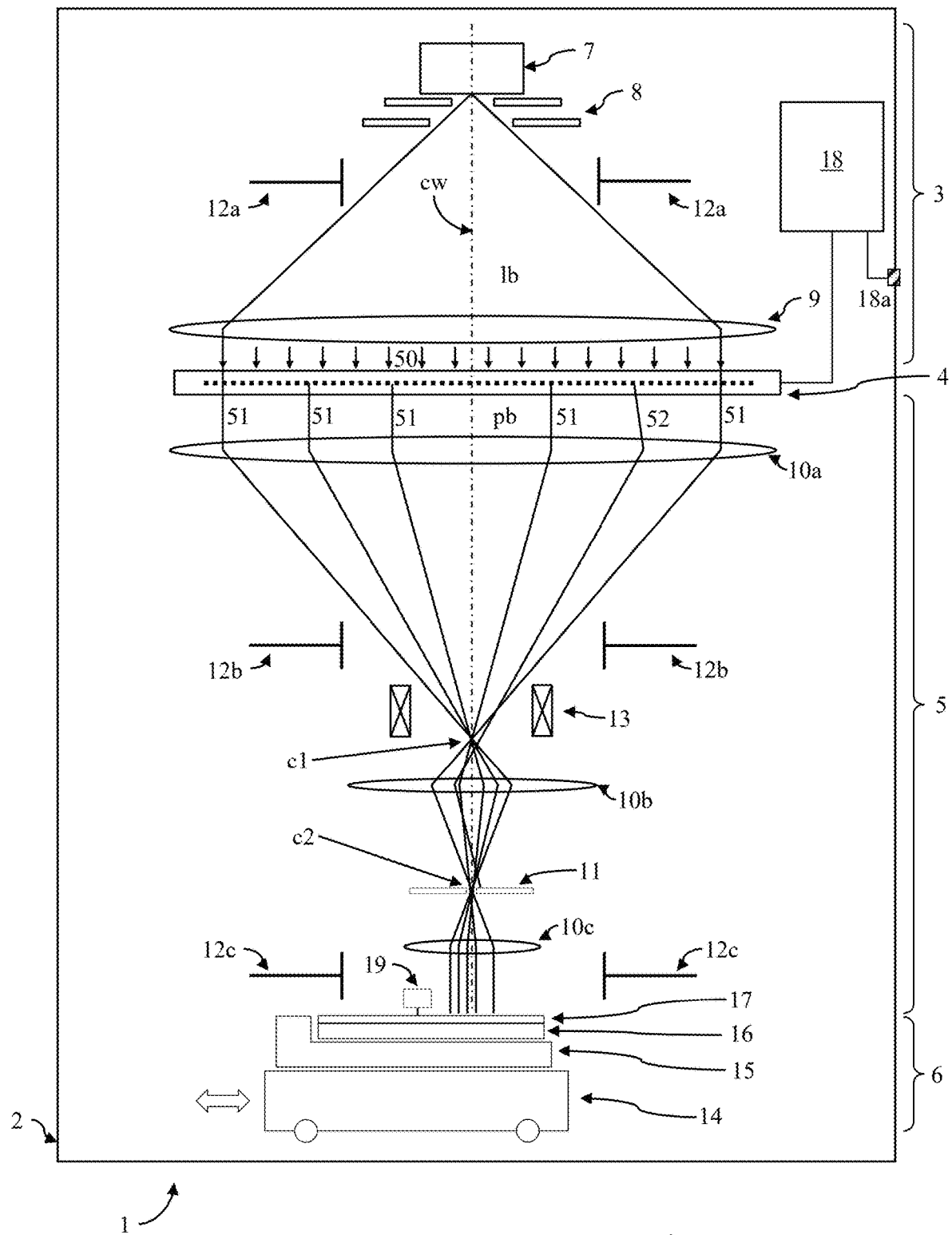
FIG. 1 a charged-particle multi-beam system of state of the art in a longitudinal sectional view.

The schematics of the multi-beam writer are shown in FIG. 1. Such a lithographic apparatus is well known in prior art, such as U.S. Pat. No. 6,768,125, EP 2187 427 A1 (=U.S. Pat. No. 8,222,621) and EP 2 363 875 A1 (=U.S. Pat. No. 8,378,320). In the following, only those details are given as needed to disclose the invention; for the sake of clarity, the components are not drawn to size in FIG. 1. The main components of the lithography apparatus 1 are—corresponding to the direction of the lithography beam lb, pb which in this example runs vertically downward in FIG. 1—an illumination system 3, a pattern definition (PD) system 4, a projecting system 5, and a target station 6 with the substrate 16. The whole apparatus 1 is contained in a vacuum housing 2 held at high vacuum to ensure an unimpeded propagation of the beam lb, pb along the optical axis cx of the apparatus. The charged-particle optical systems 3, 5 are realized using electrostatic and/or magnetic lenses.

The illumination system 3 comprises, for instance, an electron gun 7, an extraction system 8 as well as a condenser lens system 9. It should, however, be noted that in place of electrons, in general, other electrically charged particles can be used as well. Apart from electrons these can be, for instance, hydrogen ions or heavier ions, charged atom clusters, or charged molecules.

Figure 2:
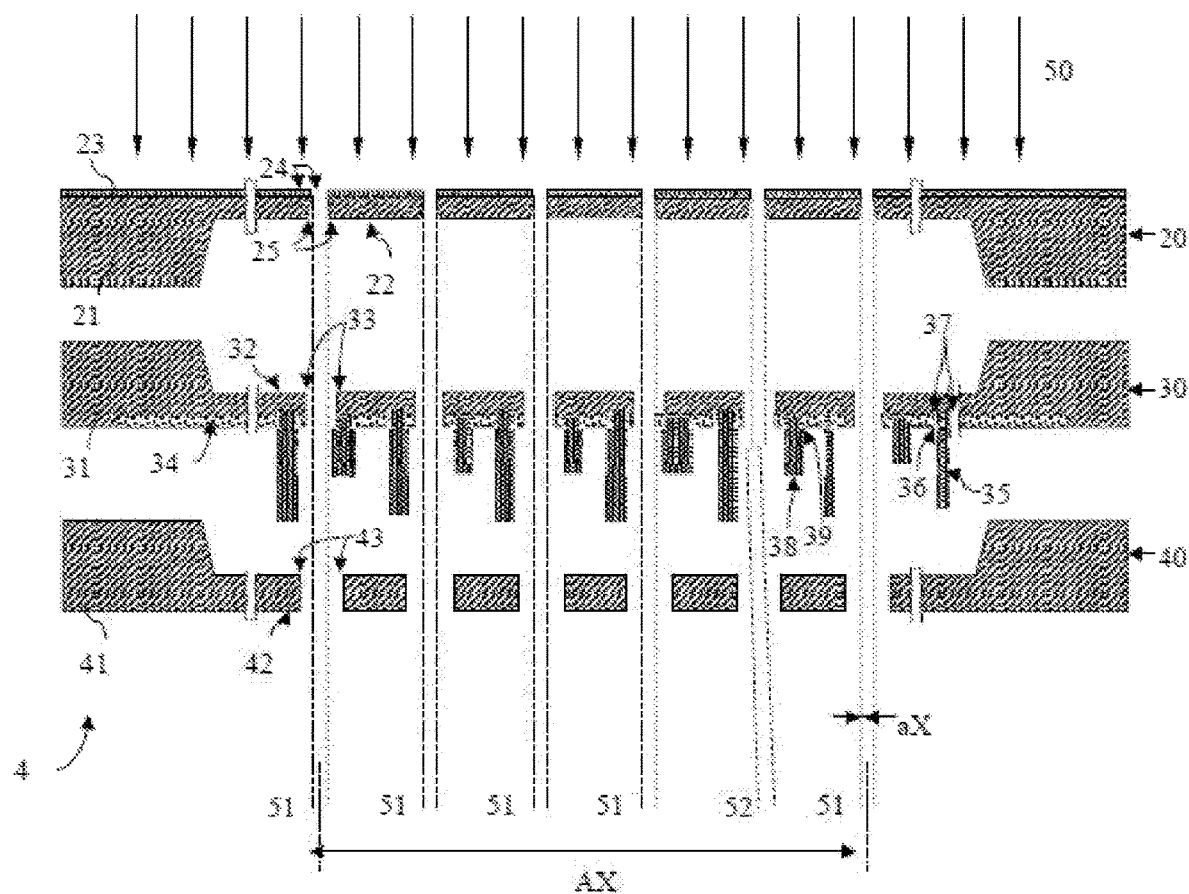
FIG. 2 a pattern definition system of state of the art in a longitudinal section.
Figure 3:
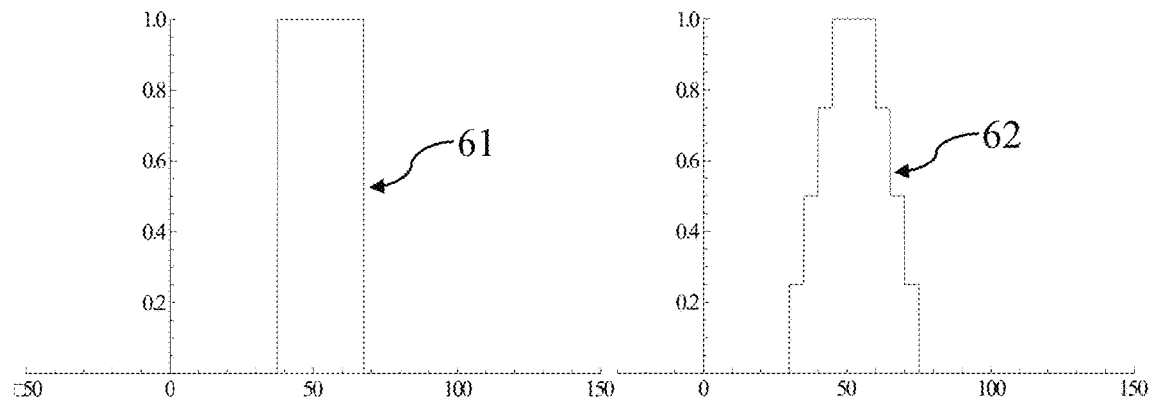
FIGS. 3A-3D illustrate intensity profiles of the multi-beam mask writer tool, namely.
Figure 3:
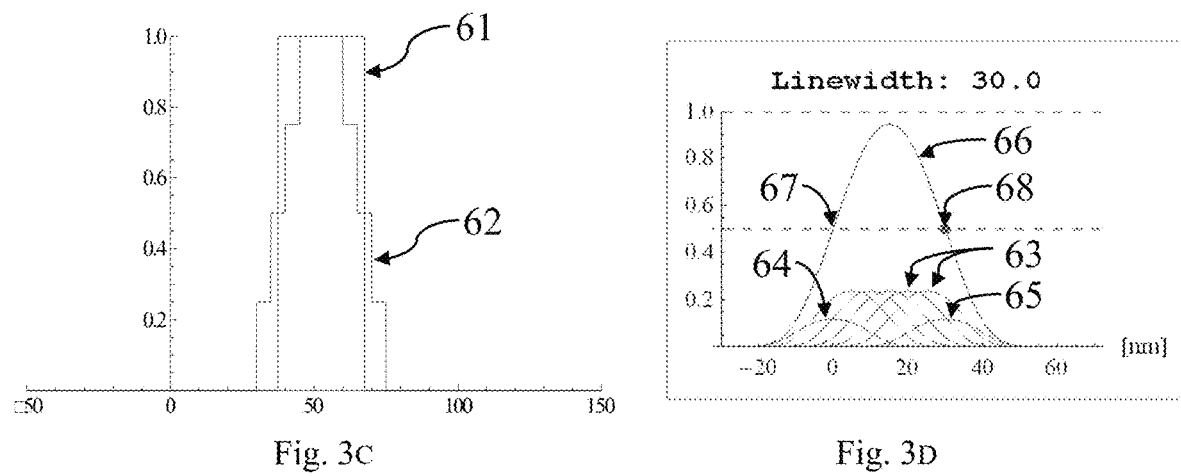
Figure 5:
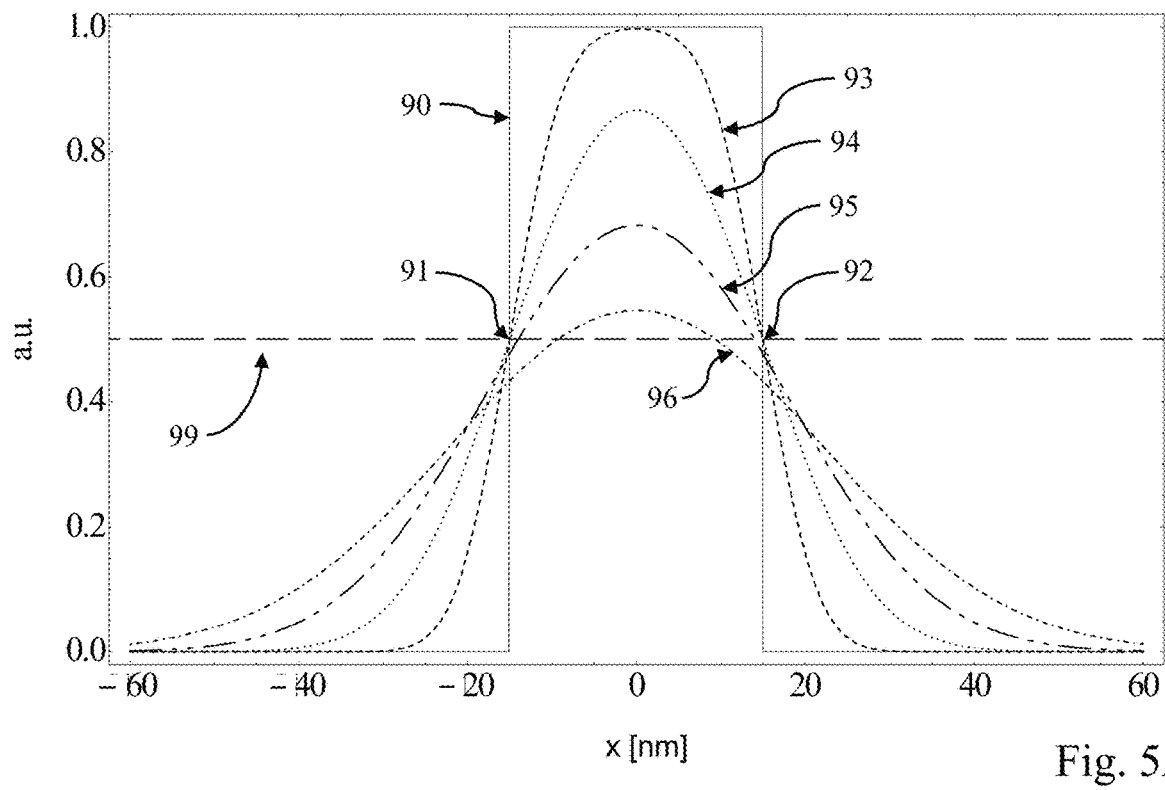
FIG. 5A shows intensity profiles of a 30 nm line as exposed with the multi-beam writer tool of the applicant.
FIG. 5B shows a detail of FIG. 5A at the left-hand flank where the intensity profiles cross the 50% intensity level.
Figure 5:
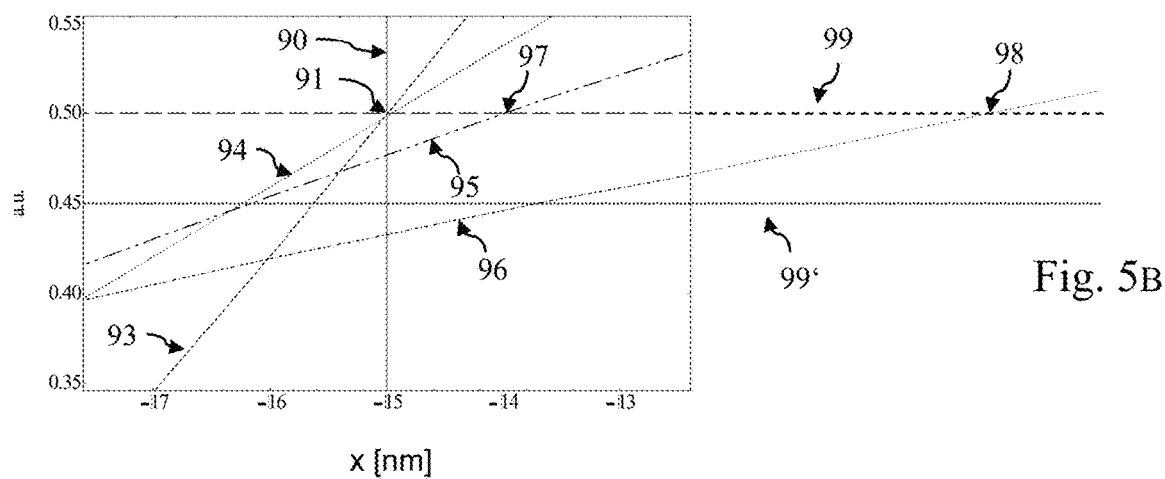

The extraction system 8 accelerates the particles to a defined energy of typically several keV, e.g. 5 keV. By means of a condenser lens system 9, the particles emitted from the source 7 are formed into a wide, substantially telecentric particle beam 50 serving as lithography beam lb. The lithography beam lb then irradiates a PD system 4 which comprises a number of plates with a plurality of openings or apertures 24 (FIG. 2). The PD system 4 is held at a specific position in the path of the lithography beam lb, which thus irradiates the plurality of apertures and is split up into a number of beamlets.

Referring to FIG. 2, some of the apertures 24 of the PD system 4 are "switched on" or "open" so as to be transparent to the incident beam in the sense that they allow the portion of the beam (beamlets 51) that is transmitted through it to reach the target; the other apertures are "switched off" or "closed", i.e. the corresponding beamlets 52 cannot reach the target, and thus effectively these apertures and/or openings are non-transparent (opaque) to the beam. Thus, the lithography beam lb is structured into a patterned beam pb, emerging from the PD system 4. The pattern of switched on apertures—the only portions of the PD system 4 which are transparent to the lithography beam lb—is chosen according to a pattern which is to be exposed on the target 16. It has to be noted that the "switching on/off" of the beamlets usually is realized by some sort of deflection means provided in one of the plates of the PD system 4: "Switched off"-beamlets are deflected off their path (by very small angles) so they cannot reach the target but are merely absorbed somewhere in the lithography apparatus, e.g. by an absorbing plate 11.

The pattern as represented by the patterned beam pb is then projected by means of an electro-magneto-optical projection system 5 onto the substrate 16 where it forms an image of the "switched-on" apertures and/or openings. The projection system 5 implements a demagnification of, for instance, 200:1 with two crossovers c1 and c2. The target or "substrate" 16 is, for instance, a 6" mask blank or a silicon wafer covered with a particle sensitive resist layer 17. The substrate is held by a chuck 15 and positioned by a substrate stage 14 of the target station 6.

The information regarding the pattern to be exposed is supplied to the PD system 4 by a data path realized by means of an electronic pattern information processing system 18 (see also the description of the data path below).

In the embodiment shown in FIG. 1, the projection system 5 is composed of a number of consecutive electro-magneto-optical projector stages 10a, 10b, 10c, consisting of electrostatic and/or magnetic lenses and other deflection means. These lenses and means are shown in symbolic form only, since their application is well known in the prior art. The projection system 5 employs a demagnifying imaging through crossovers c1, c2. The demagnification factor for both stages is chosen to achieve an overall demagnification of several hundreds, e.g. 200:1. A demagnification of this order is in particular suitable with a lithography setup, in order to alleviate problems of miniaturization in the PD device.

In the whole projection system 5, provisions are made to extensively compensate chromatic and geometric aberrations. As a means to shift the image laterally as a whole, i.e. along a direction perpendicular to the optical axis cx, deflection means 12a, 12b and 12c are provided in the condenser 3 and projection system 5. The deflection means can be realized as, for instance, a multipole electrode system which is positioned near the source extraction system (12a), near the first crossover, as shown in FIG. 1 with the deflection means 12b, and/or after the final lens 10c of the respective projector, as in the case with the stage deflection means 12c in FIG. 1. In this apparatus, a multipole electrode arrangement is used as deflection means both for shifting the image in relation to the stage motion and for correction of the imaging system in conjunction with the charged-particle optics alignment system. These deflection means 10a, 10b, 10c are not to be confused with the deflection array means of the PD system 4 which, in conjunction with the stopping plate 11, are used to switch selected beamlets of the patterned beam pd to "on" or "off" state, since the former only deal with the particle beam as a whole. There is also the possibility to rotate the ensemble of programmable beams using a solenoid 13 providing an axial magnetic field.

As can be seen in the sectional detail of FIG. 2, the PD system 4 preferably comprises three plates stacked in a consecutive configuration: An "Aperture Array Plate" (AAP) 20, a "Deflection Array Plate" (DAP) 30 and a "Field-boundary Array Plate" (FAP) 40. It is worthwhile to note that the term 'plate' refers to an overall shape of the respective device, but does not necessarily indicate that a plate is realized as a single plate component even though the latter is usually the preferred way of implementation; still, in certain embodiments, a 'plate', such as the aperture array plate, may be composed of a number of sub-plates. The plates are preferably arranged parallel to each other, at mutual distances along the Z direction.

The flat upper surface of AAP 20 forms a defined potential interface to the condenser optics/illumination system 11. The AAP may, e.g. be made from a square or rectangular piece of a silicon wafer (approx. 1 mm thickness) 21 with a thinned center part 22. The plate may be covered by an electrically conductive protective layer 23 which will be particularly advantageous when using hydrogen or helium ions (line in U.S. Pat. No. 6,858,118). When using electrons or heavy ions (e.g. argon or xenon), the layer 23 may also be of silicon provided by the surface section of 21 and 22, respectively, so that there is no interface between layer 23 and bulk parts 21/22, respectively.

The AAP 20 is provided with a plurality of apertures 24 realized as openings traversing the thinned part 22. In the embodiment shown the apertures 24 are realized having a straight profile fabricated into the layer 23 and a "retrograde" profile in the bulk layer of the AAP 20 such that the downward outlets 25 of the openings are wider than in the main part of the apertures 24. Both the straight and retrograde profiles can be fabricated with state-of-the-art structuring techniques such as reactive ion etching. The retrograde profile strongly reduces mirror charging effects of the beam passing through the opening.

The DAP 30 is a plate provided with a plurality of openings 33, whose positions correspond to those of the apertures 24 in the AAP 20, and which are provided with electrodes 35, 38 configured for deflecting the individual sub-beams passing through the openings 33 selectively from their respective paths. The DAP 30 can, for instance, be fabricated by post-processing a CMOS wafer with an ASIC circuitry. The DAP 30 is, for instance, made from a piece of a CMOS wafer having a square or rectangular shape and comprises a thicker part 31 forming a frame holding a center part 32 which has been thinned (but may be suitably thicker as compared to the thickness of 22). The aperture openings 33 in the center part 32 are wider compared to the apertures 24 (by approx. 2 µm at each side for instance). CMOS electronics 34 is used to control the electrodes 35, 38, which are provided by means of MEMS techniques. Adjacent to each opening 33, a "ground" electrode 35 and a deflection electrode 38 are provided. The ground electrodes 35 are electrically interconnected, connected to a common ground potential, and comprise a retrograde part 36 to prevent charging and an isolation section 37 in order to prevent unwanted shortcuts to the CMOS circuitry. The ground electrodes 35 may also be connected to those parts of the CMOS circuitry 34 which are at the same potential as the silicon bulk portions 31 and 32.

The deflection electrodes 38 are configured to be selectively applied an electrostatic potential; when such electrostatic potential is applied to an electrode 38, this will generate an electric field causing a deflection upon the corresponding sub-beam, deflecting it off its nominal path. The electrodes 38 as well may have a retrograde section 39 in order to avoid charging. Each of the electrodes 38 is connected at its lower part to a respective contact site within the CMOS circuitry 34.

The height of the ground electrodes 35 is higher than the height of the deflection electrodes 38 in order to suppress cross-talk effects between the beams.

The arrangement of a PD system 12 with a DAP 30 having electrodes oriented downstream as shown in FIG. 2 is only one of several possibilities. Further DAP configurations, e.g. with embedded ground and deflection electrodes, can easily be devised by the skilled person (see other patents in the name of the applicant, such as U.S. Pat. No. 8,198,601).

The third plate 40 serving as FAP has a flat surface facing to the first lens part of the down-stream demagnifying charged-particle projection optics and thus provides a defined potential interface to the first lens 16a of the projection optics. The thicker part 41 of FAP 40 is a square or rectangular frame made from a part of a silicon wafer, with a thinned center section 42. The FAP 40 is provided with a plurality of openings 43 which correspond to the openings 24, 33 of the AAP 20 and DAP 30 but are wider as compared to the latter.

The PD system 4, and in particular the first plate thereof, the AAP 20, is illuminated by a broad charged particle beam 50 (herein, "broad" beam means that the beam is sufficiently wide to cover the entire area of the aperture array formed in the AAP), which is thus divided into many thousands of micrometer-sized beams 51 when transmitted through the apertures 24. The beamlets 51 and 52 will traverse the DAP and FAP unhindered.

As already mentioned, whenever a deflection electrode 38 is powered through the CMOS electronics, an electric field will be generated between the deflection electrode and the corresponding ground electrode, leading to a small but sufficient deflection of the respective beam 52 passing through (FIG. 2). The deflected beam can traverse the DAP and FAP unhindered as the openings 33 and 43, respectively, are made sufficiently wide. However, the deflected beam 52 is filtered out at the stopping plate 15 of the sub-column (FIG. 1). Thus, only those beams which are unaffected by the DAP will reach the substrate.

The reduction factor of the demagnifying charged-particle optics 16 is chosen suitably in view of the dimensions of the beams and their mutual distance in the PD device 4 and the desired dimensions of the structures at the target. This will allow for micrometer-sized beams at the PD system whereas nanometer-sized beams are projected onto the substrate.

The ensemble of (unaffected) beams 51 as formed by AAP is projected to the substrate with a predefined reduction factor R of the projection charged-particle optics. Thus, at the substrate a "beam array field" (BAF) is projected having widths $BX=AX/R$ and $BY=AY/R$, respectively, where AX and AY denote the sizes of the aperture array field along the X and Y directions, respectively. The beam size of an individual beam at the substrate is given by $bX=aX/R$ and $bY=aY/R$, respectively, where aX and aY denote the sizes of the beam 51 as measured along the X and Y directions, respectively, at the level of the DAP 30.

It is worthwhile to note that the individual beams 51, 52 depicted in FIG. 2 are representative of a much larger number of sub-beams, typically many thousands, arranged in a two-dimensional X-Y array. The applicant has, for instance, realized multi-beam charged-particle optics with a reduction factor of R=200 for ion as well as electron multi-beam columns with many thousands (e.g., 262,144) programmable beams. The applicant has realized such columns with a beam array field of approx. 82 µm×82 µm at the substrate. These examples are stated for illustrative purpose, but are not to be construed as limiting examples.

As a typical implementation of an MBMW, the applicant has realized a 50 keV electron MBMW providing 512×512 (262,144) programmable beamlets of 20 nm beam size within a 81.92 µm×81.92 µm beam array field at the substrate. For the realized writer system the substrate is a 6" mask blank (area: 6"×6"=152.4 mm×152.4 mm, thickness: 1"/4=6.35 mm) covered with an electron beam sensitive resist. Furthermore, in the realized system of the applicant multi-beam writing is possible on resist covered 150 mm Si wafers.

The current density of the realized MBMW system of the applicant is ≤1 A/cm$^2$ when using 20 nm beam size. Thus, when all programmable 262,144 beamlets are "on" the current is ≤1.05 µA.

The MBMW column as realized by the applicant has a 1sigma blur of approx. 5 nm, as verified experimentally and published in "eMET POC: Realization of a proof-of-concept 50 keV electron multibeam Mask Exposure Tool", by Elmar Platzgummer et al., in Proc. of SPIE Vol. 8166, 816622-1 (2011).

There is the possibility to change the beam size from 20 nm to e.g. 10 nm. For a column with 200:1 reduction this is straightforward by using an aperture array plate (AAP) with 2 µm×2 µm opening size of the apertures instead of 4 µm×4 µm opening size. As outlined in U.S. Pat. No. 8,546,767 of the applicant, there is also a possibility of an in-situ change of the beam size.

The first generation MBMW production tools are targeted to use 20 nm and 10 nm beams providing up to approx. 1 µA current for all 262,144 programmable beams "on". For following generations of MBMW production tools there is the plan to use even smaller beam size of e.g. 8 nm and concurrently to provide e.g. 640×640=409,600 beamlets within the 81.92 µm×81.92 µm beam array field at the substrate.

The multi-beam writing method proposed by the applicant also includes a method using the same spot size, e.g. 20 nm, with an overlap between the spots, with a selected amount of overlap. In the "Double Grid" multi-beam exposure, the overlap between the spots is half of the beam size in X as well as in Y direction. In the "Quad Grid" multi-beam exposure, the overlap between the spots is a quarter of the beam size in X as well as in Y direction. The spot size at the substrate is aX/R where aX is the opening width of the apertures in the aperture array plate (FIG. 2) and R is the reduction factor of the charged-particle projection optics. Each spot is exposed with discrete dose levels. For instance, when using 4 bits for programming the dose levels, the dose level of each spot can be selected to be 0, 1, 2, . . . 14, or 15 units.

Figure 12:
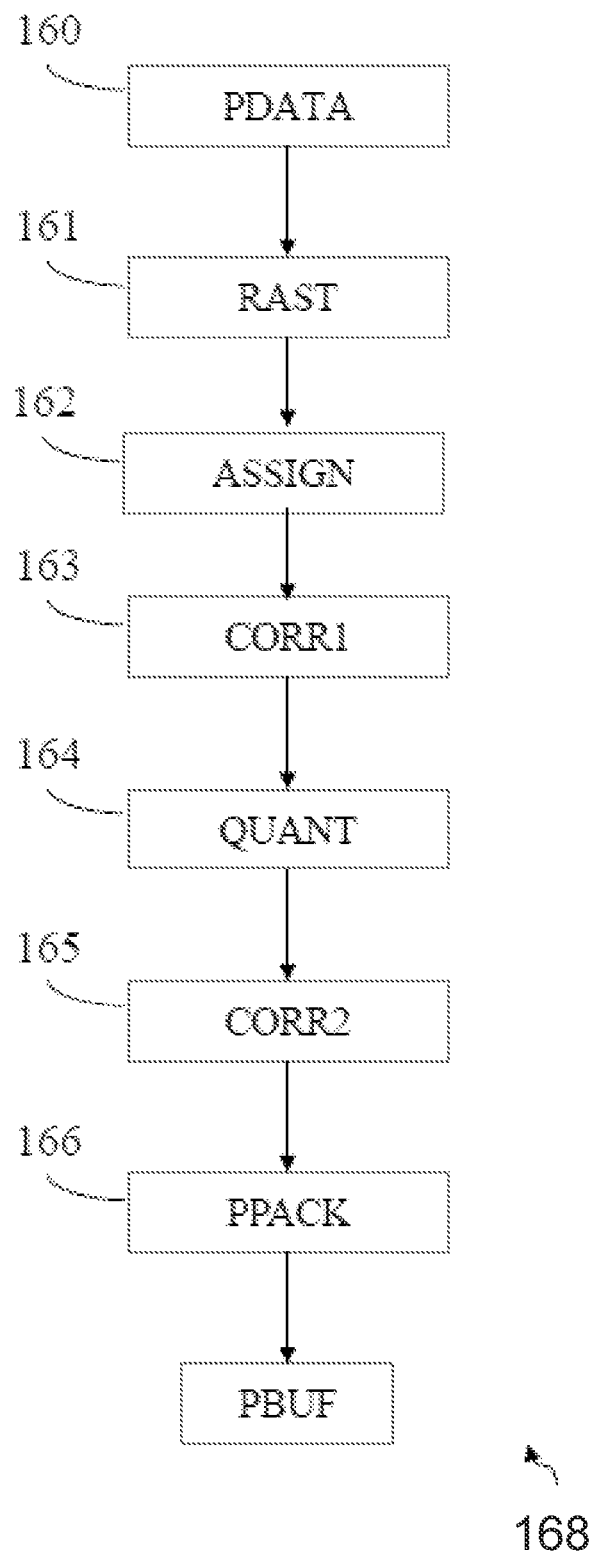
FIG. 12 shows the data path of the MBW.

The part of the processing system 18 of the writer tool (FIG. 1) that converts the patterns to be written to beamlet dose assignments (as described above), which can be used in the writing process, is referred to as "Data path". FIG. 12 shows a flowchart of the datapath 170 in the context of the invention. The data path is preferably performed in real time; in a variant, part or all of the calculations of the data path may be performed in advance, for instance in a suitable computer.

The complete pattern image comprises a vast amount of image data, which is why for efficient computation of those data a high-speed datapath that generates the pixel data to be exposed, preferably in real-time, will be suitable. The pattern to be exposed is typically described in a vector format, e.g. as a collection of geometries like rectangles, trapezoids or general polygons, which typically offers better data compaction and therefore reduces the requirements on data storage. In this context. the datapath consists of three major parts:

- a vector-based physical correction process (step 160),
- rasterization processes to translate the vector to pixel data (steps 161 to 164), and
- buffering of pixel data for temporarily storage for the writing process (steps 165 and 166).

The datapath starts upon being supplied a pattern PDATA to be exposed at step 160. In step 160, generally, the pattern PDATA to be exposed is split into a large number of small data chunks, possibly with geometric overlaps. Corrections that can be applied in the vector domain (e.g. proximity effect correction) may be carried out to all chunks independently, possibly in parallel, and the resulting data is sorted and coded in a way to improve computation speed of the following steps. The output is a collection of chunks where all chunks contain a collection of geometries.

Stage 161: Rasterization RAST. The geometries of every chunk are converted into rasterized pixel graphics. In this step, each pixel is assigned a floating-point gray scale intensity depending on the geometric overlap of the corresponding surface of the raster-grid cell with the pattern to be exposed, i.e. the entity of all associated chunks. This floating-point intensity represents the ideal physical exposure dose to be delivered onto the target at the respective pixel location. In more detail, every pixel that is completely inside a geometry is assigned the maximal intensity, whereas the intensity of pixels that crosses an edge of a geometry is weighted by the fraction of the area of the pixel that is covered by the geometry. This method implies a linear relation between the area of the geometry and the total dose after the rasterization.

Stage 162: Pixel-to-beamlet assignment ASSIGN. In this step, given a particular write sequence, it is determined which pixel will be written by which beamlet.

Stage 163: Pixel based corrections CORR1. In this step, all corrections that can be applied in the pixel domain are performed. These corrections comprise compensation of deviations from a uniform current density of the beam 50 over the aperture field (as described earlier and in US 2015/0347660 A1) and/or correction for individual defective beam deflectors in the DAP 30 (as in US 2015/0248993 A1). Pixel based corrections are realized by modifying the floating-point intensity of each individual pixel. This is being done with respect to the Pixel-to-beamlet assignment of Stage 162, which makes it possible to define and apply a compensation dose-factor q (or, equivalently a dose-shift s) for each pixel depending on by which beamlet it is written, and/or by which beamlets the neighboring pixels are written.

Stage 164: Quantization QUANT. The quantization process converts the possibly corrected, floating-point intensity of each pixel into a quantized (or equivalently 'discrete') gray level, given a predetermined gray value scale.

Stage 165: Further optional pixel based corrections CORR2 in the gray-level pixel data domain may be applied (not part of the present invention).

Stage 166: Pixel packaging, PPACK. The pixel image obtained from stage 164 is sorted according to the placement grid sequence and sent to a pixel buffer PBUF which is provided in the processing system 18 of the writer tool (FIG. 1). The pixel data is buffered until a sufficient amount of data, typically at least the length of a stripe, is present which triggers the exposure of the stripe (see FIG. 7). The data is taken out of the buffer during the writing process. After the stripe has been written, the process described above starts anew for the pattern data of the next region, such as the next stripe.

In FIG. 3A, an illustration for the case of a zero blur, the ideal intensity profile 61 is shown for a line with 30 nm width. When using "Quad Grid" multi-beam exposure, the overlap is a quarter of the beam size. Thus, for the case of using 20 nm beam size the physical grid size is 5 nm. A discrete dose level can be assigned to each physical grid area, which is 5 nm×5 nm for the example shown, and in FIG. 3B the discrete dose levels 62 applied for generating the 30 nm line are indicated. FIG. 3C shows the superposition of the zero blur intensity profile 61 (FIG. 3A) and the dose level histogram 62 (FIG. 3B). In the general case the dose level histogram will not be symmetrical in order to position the left and right edge at pre-defined positions. In FIG. 3D a simulation is shown for a line of 30.0 nm width with the left edge to be positioned at 0.0 nm and the right edge at 30.0 nm. For the simulation, exposure of 20 nm beam spots with a 1sigma blur of 5.1 nm (12.0 nm FWHM blur) was assumed. The intensity profile 66 is formed by overlapping exposure spots 63, 64, and 65. The dose level of the leftmost exposure spot 64 is adjusted such that the 30 nm line starts at position 67, i.e. the desired 0.0 nm position. The dose level of the rightmost exposure spot 65 is adjusted such that exposed line ends at 68 with 30.0 nm width. As shown in FIG. 3D, the overlap of the 20 nm exposure spots 63, 64, 65 is a quarter of the beam size, i.e. 5 nm ("Quad Grid").

Using the multi-beam exposure tool with 20 nm beam size and Quad Grid exposure (5 nm physical grid size), the line width can be changed in steps of 0.1 nm. As examples, FIG. 4A shows the intensity profile for 31.4 nm line width and FIG. 4B for 40.0 nm line width. Because of the integer dose levels there are slight deviations from the 0.1 nm address grid. These deviations are indicated as "edge position error" in the upper parts of FIG. 4A and FIG. 4B, as functions of the desired line width, in 0.1 nm steps between 30.0 nm and 40.0 nm. As can be seen the deviations are within ±0.05 nm. Furthermore, the changes of edge position with 10% change of dose, as shown in the lower parts of FIG. 4A and FIG. 4B, are approx. 1 nm, varying only slightly for different line widths. In other words, since the dose is controlled in a multi-beam writer tool of the applicant to better than 1%, there is only approx. 0.1 nm change of edge position with 1% change of dose.

When writing a pattern on a substrate such as a 6" mask blank or silicon wafer, there are non-ideal situations which have to be taken into account during the multi-beam writing process in order to realize a mask or wafer with desired features and pattern fidelity. Possible problems to be taken into account are e.g. distortions of the substrate due to processing, distortions of the beam array field which cannot be corrected via optical deflection means, blur or dose inhomogeneity within the beam array field, "loading effects" in a subsequent etching process, or charge induced influences. These effects can be simulated and/or measured.

FIGS. 5A and 5B illustrate the effect of dose and blur variations on line width. Neglecting blur ("zero blur"), the intensity profile 90 is shown for a line with 30 nm line width. In FIG. 5A, the exposure dose (indicated by the height of the zero blur intensity profile 90) is chosen to be double of the "dose to clear" (indicated by the "0.5" level 99 of the intensity profile) separating regions with and without resist development from each other. This choice of dose is called "isofocal dose" since it guarantees that the edge position is largely independent of the focus or blur of the exposing beamlets, as long as the feature size is in the order of or greater than the 3-sigma blur. As shown in FIG. 5B (a close-up of FIG. 5A at the nominal edge position 91), if the dose deviates significantly from the isofocal dose, or the feature size is significantly smaller than the 3-sigma blur, the exposed edge position will be different the nominal desired position 91 and, in particular, fluctuate under blur variations. In the depicted example, the exposed edge positions of the intensity profiles 93, 94 at isofocal dose (their intersection with the dose-to-clear 99), which correspond to 5 and 10 nm 1-sigma blur, coincide with the nominal positions 91, 92, but the edge positions 97, 98 of the intensity profiles 95, 96, which correspond to 15 and 20 nm 1-sigma blur, increasingly deviate from the nominal position. If a pattern is over- or under-dosed relative to the isofocal dose, the exposed edge position will, in general, no longer coincide with the nominal edge position and depend on the blur of the beamlets writing the pattern. In FIG. 5B, if the dose-to-clear is moved to the "0.45" level 99' (which corresponds to a dose increase of 11%) the exposed pattern edges will move to the left and no longer coincide, even for the low-blur dose profiles 93, 94.

Distortions within the plane of the target, in particular shifts along X and/or Y directions, rotating or shearing of local elements of the target plane, have been dealt with in U.S. Pat. No. 9,568,907 (EP 2 993 684) of the applicant. In US 2014/0168629 A1 it was observed that also a distortion along the direction vertical to the plane of the target, i.e. an elevation relative to the target plane, may lead to a spatial distortion of the exposed patterns. This is a consequence of the fact that the spatial shift experienced by a pattern on the target may be caused by, or depend on, the elevation of the target plane. For instance, the landing angle of the beam may deviate from the nominal beam direction, which usually is assumed to be exactly perpendicular to the (nominal) target plane. This deviation will lead to a spatial displacement of the features generated on the target where the target elevation deviates from the nominal height.

For industrial applications, very demanding MBW performance requirements are imposed with respect to achieving a small Critical Dimension (CD) and, in particular, to achieving 3sigma or 6sigma variations at a nanometer level of the Local CD Uniformity (LCDU) within small fields (e.g. the area of the MBW beam array field), as well as nanometer-level 3sigma or 6sigma variations of the Global CD Uniformity (GCDU) over the whole MBW writing field on a substrate (e.g. a 6" mask blank or a 300 mm Silicon wafer).

As described above, in a typical MBW the "dose-slope", i.e., the variation of edge position or CD of a feature when incrementing the exposure dose by a unit dose, depends on the blur of the beamlets writing the feature. Therefore, an error source of particular importance arises from the inhomogeneity of blur within the image field (beam array field), since it may lead to unwanted local CD signatures, especially when over-dosing or under-dosing relative to isofocal dose occurs or when features smaller than the 3-sigma-blur are exposed. In U.S. Pat. No. 9,520,268 the applicant presented a method to compensate deviations of critical dimension due to inherent variations of blur within the image field by two or more convolution kernels which are applied to the patterns to be exposed and compensate for the blur variations.

The inventors observed that changes of target elevation relative to the nominal plane may not only lead to spatial distortion of the exposed patterns as described in US 2014/0168629 A1, but also to a change of blur and its distribution within the image field. If these variations are not accounted for, this may in turn lead to unwanted CD variations across the mask, possibly violating GCDU requirements. Relative elevation, which is typically in the order of several micrometers, may change as a function of position (e.g. due to uneven mask topology), as a function of time (e.g. due to heating of the target during a process, or varying external air pressure, which may affect the shape of the exposure apparatus and hence change its focal and image planes), but also as a function of the total current in the charged-particle optical system 5 (e.g. due to electron interactions in the crossovers c1 and c2 affecting the image plane).

Therefore, it is an aim of the invention to provide approaches for dealing with the effect of target elevation and associated variation of blur.

Elevation Variation and Effect Upon Blur

Figure 6:
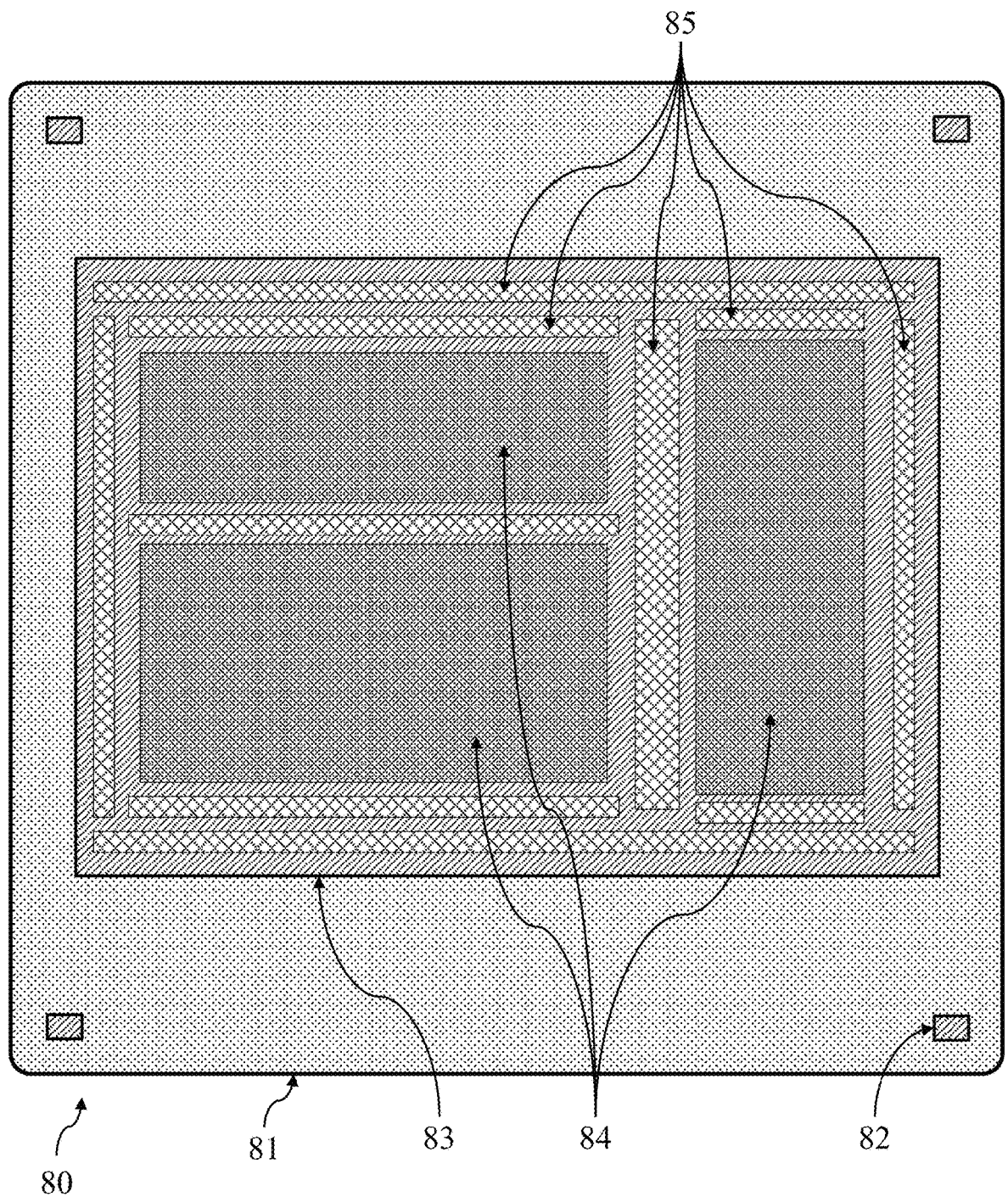
FIG. 6 shows a typical example of the layout of a 6" photomask substrate.

FIG. 6 illustrates one example of a target where a locally varying elevation (i.e., elevational distortion) may occur, namely, a 6" photomask blank 80 consisting of a 6"×6"×1"/4 quartz glass plate 80 covered with an electrically conducting masking layer and an electron beam sensitive resist in an exposure area 81. Within a mask pattern field 83 (which represents one example of the exposure area of the invention) there may be areas of different density of exposed spots, for instance high density 84 and low density 85 pattern areas. In addition, usually there are subfields 82 with patterns for alignment purposes. Already the fact that the areas 84, 85, 82 have different values of pattern density will often give rise to varying impact of heating, as one cause for spatial variation of target elevation. Of course the invention is not restricted to this type of target but is applicable to a wide range of targets and substrate.

Figure 7A:
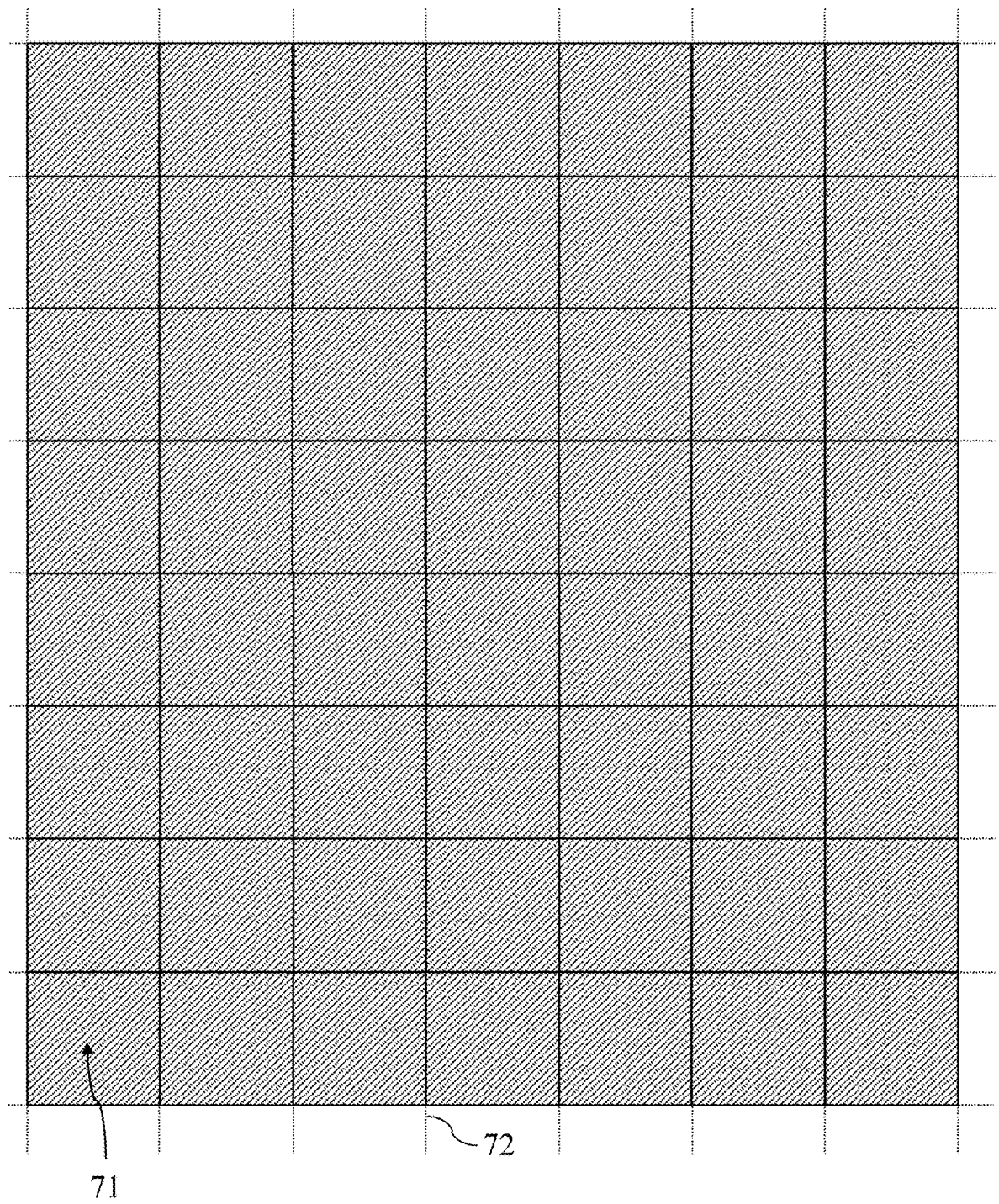
FIG. 7A shows an exemplary segmentation of an exposure area.

According to many preferred embodiments of the invention, the exposure area is divided into a plurality of discrete sub-regions, hereinafter also referred to as "segments". FIG. 7A shows one example of an exposure area (shown is a part of the area of the substrate pattern field) segmented into segments 71. The segmentation may, but need not, be in accordance with a regular grid and/or correspond to a grid aligned along a mathematical straight-lines grid 72. Preferably, the sub-regions may be realized as rectangular or quadratic segments 71. It should be noted that within the present invention any other types of finite-element-coverings of said area may be used as well. Here, the size (or, area) of the segments (which generally is inversely proportional to their number) is related to the available computational power (speed of the data path) and demanded precision. Apart from this limitation, the actual segmentation may be chosen freely; advantageously, however, the segmentation may be chosen in an appropriate manner with respect to the given or expected elevational distortions and blur variations generated thereby. In a typical realization of the invention, the computational power should allow for a minimal segment size which is smaller than the beam array field of the multi-beam writer.

Figure 10:
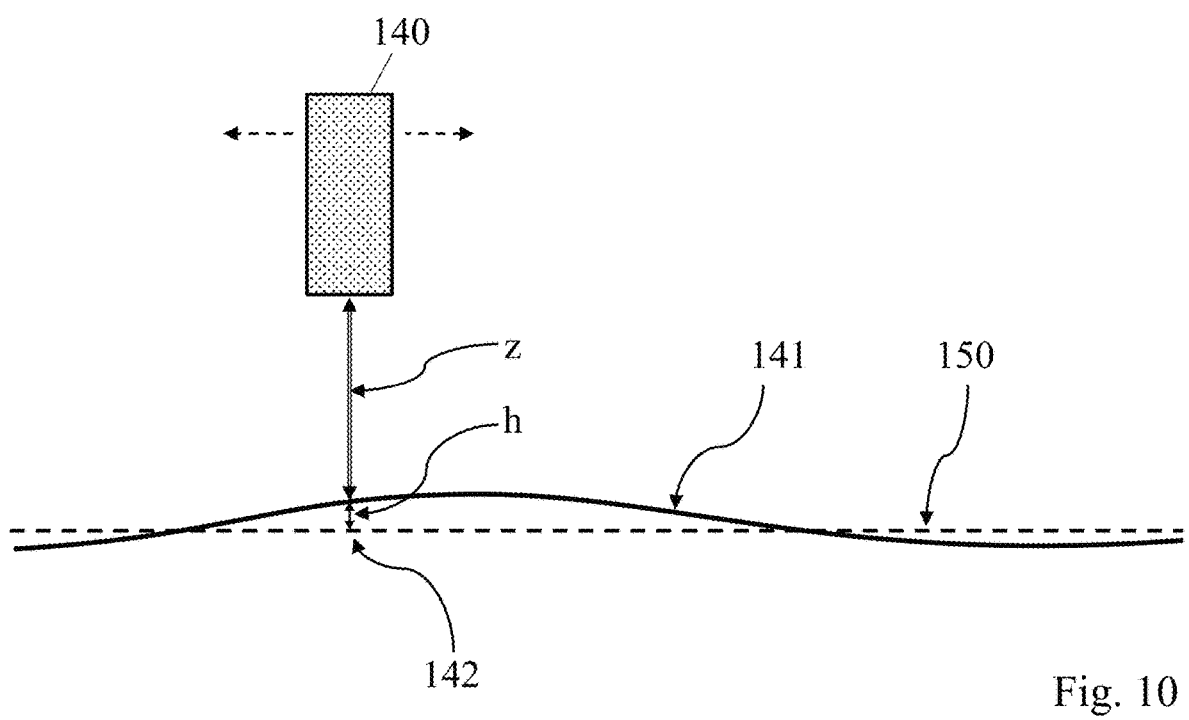
FIG. 10 shows the measurement of elevation on a target with elevational distortion.

An example of a height profile of the substrate is illustrated in FIG. 10, which shows a schematic depiction of a target profile according to a fictive section perpendicular to the target plane. An actual shape of the target surface 141 exhibits a certain deviation h from a nominal target plane 150 at a reference point 142 (which usually coincides with a location of measurement) on the plane 150. The height profile may be defined by the positions of respective elements (such as the sub-regions) in the exposure area along the optical axis, also referred to as its Z coordinate value z; the elevation is the difference of the actual z value from the expected z value, which would coincide with the nominal target plane 150. The scale of the elevation is greatly exaggerated in FIG. 10 as compared to the scale of the lateral dimensions (X/Y) of the target.

Figure 7B:
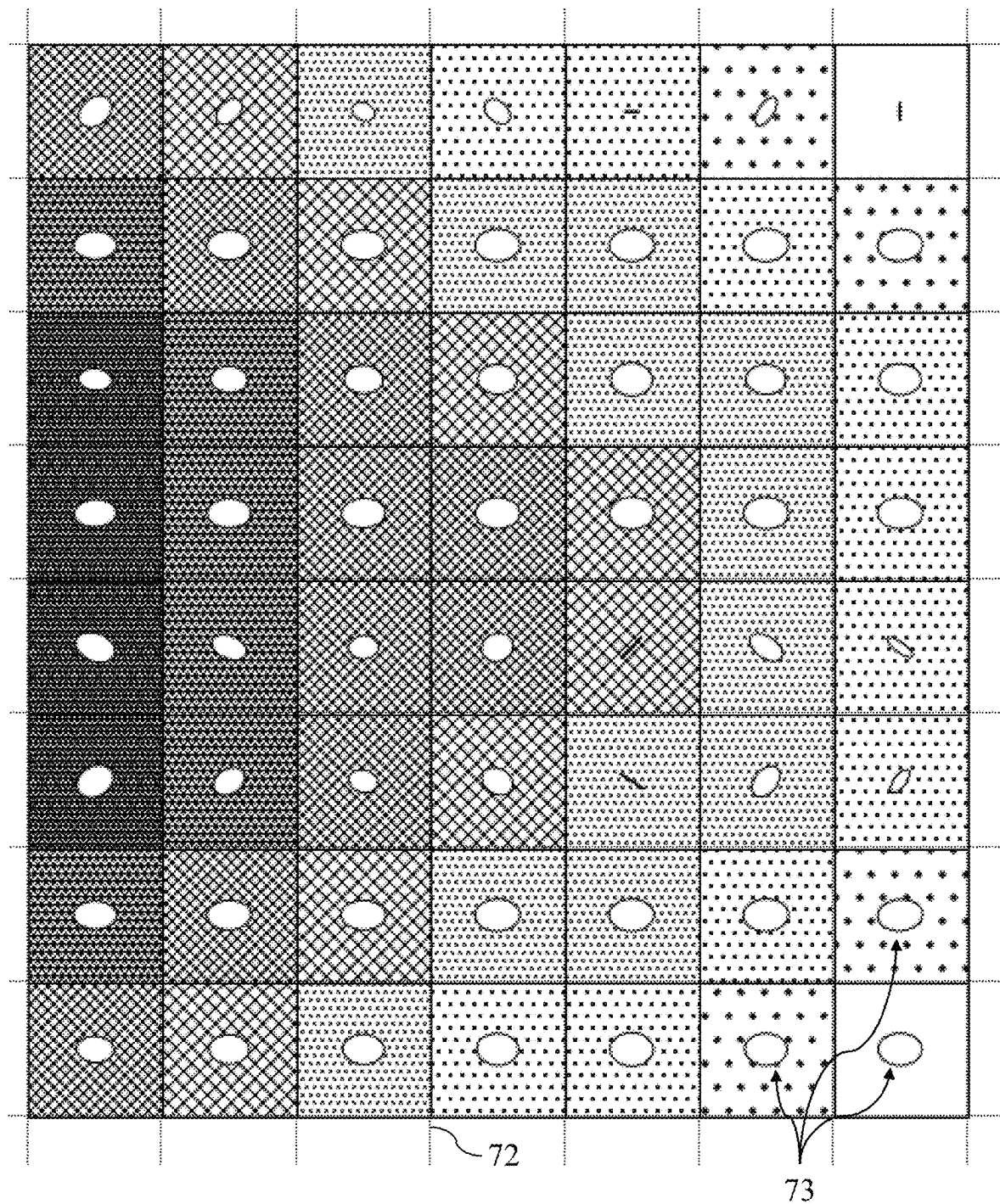
FIG. 7B illustrates the assignment of homogenizing blur to the segments of FIG. 7A.
Figure 7C:
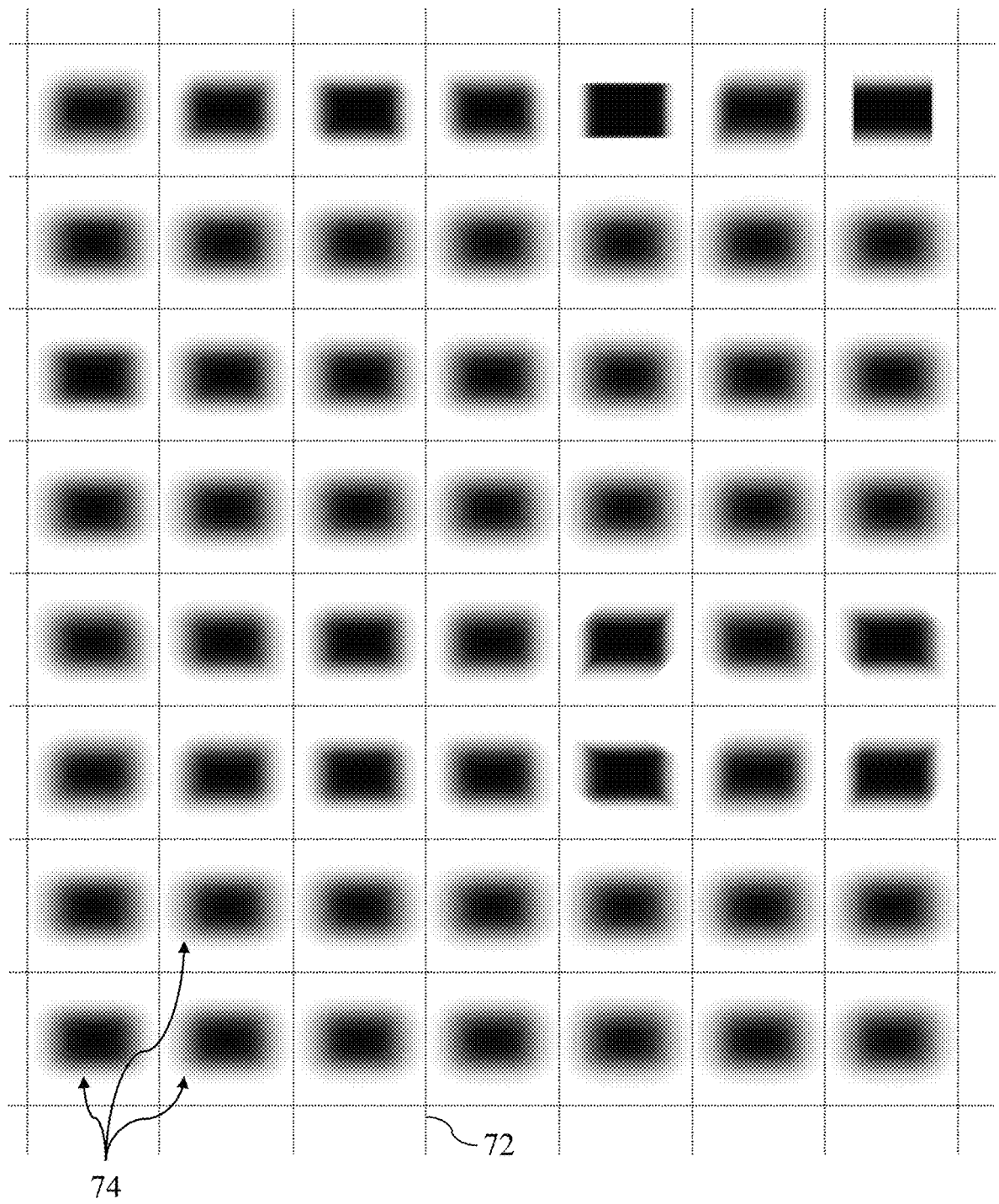
FIG. 7C illustrates the effect of homogenizing blur on the data elements on the target.

Each of said segments 71 is assigned an individual correction of blur inhomogeneity which is caused by elevational distortion, which is obtained from model-based and/or measurement-based analyses of the elevation variation and blur as a function of the target deviating from the nominal target plane affecting the multi-beam writer tool and specifically the target. In order to correct for the effect of variation of blur, the invention proposes to apply a "homogenizing blur", in addition to the blur already present, so as to raise the blur to a "target blur". This is done, e.g., by introducing an additional blur to the respective segments, for instance, by using kernels to implement a convolution of the rasterized data with a Gaussian filter of variable scale. A similar implementation of kernels using a Gaussian filter was proposed by the applicant in U.S. Pat. No. 9,520,268 B2 in order to correct for undesired anisotropy. FIG. 7B shows an example of an assignment of homogenizing blur to the segmentation of FIG. 7A. The ellipses 73 represent 1-sigma level sets of Gaussian blur, which is applied to the exposure data in the respective segments, resulting in pre-blurred data on the target, as illustrated in FIG. 7C by data elements 74, which each symbolize the blur of a single rectangle per segment (a rectangle with sharp edges would correspond to no additional blur). The sub-region elevation in each of the segments 72 is denoted through hatching shade, with lighter shades denoting bright elevated sub-regions and darker shades sub-regions lowered relative to the nominal plane. Since the elevation varies only slightly across the target plane, as a simplification it is assumed that the elevation may be treated as constant within each segment 72, taking the value of the elevation at a reference point, such as the center of the area of the segment, or averaging the elevation over several points of measurements. The location of the reference point is chosen at a suitable location for each segment. Also, it may be suitable to have several measurement points in a segment, and the reference point is chosen from the measurement points where the elevation assumes a representative value (e.g., a median value) among the corresponding elevation values; or the average of the elevation values is taken as the elevation for the reference point. Note that the blur applied to the rectangles in each segment of FIG. 7C is depicted exaggerated for sake of clarity and will, in general, vary between the different segments.

Figure 8:
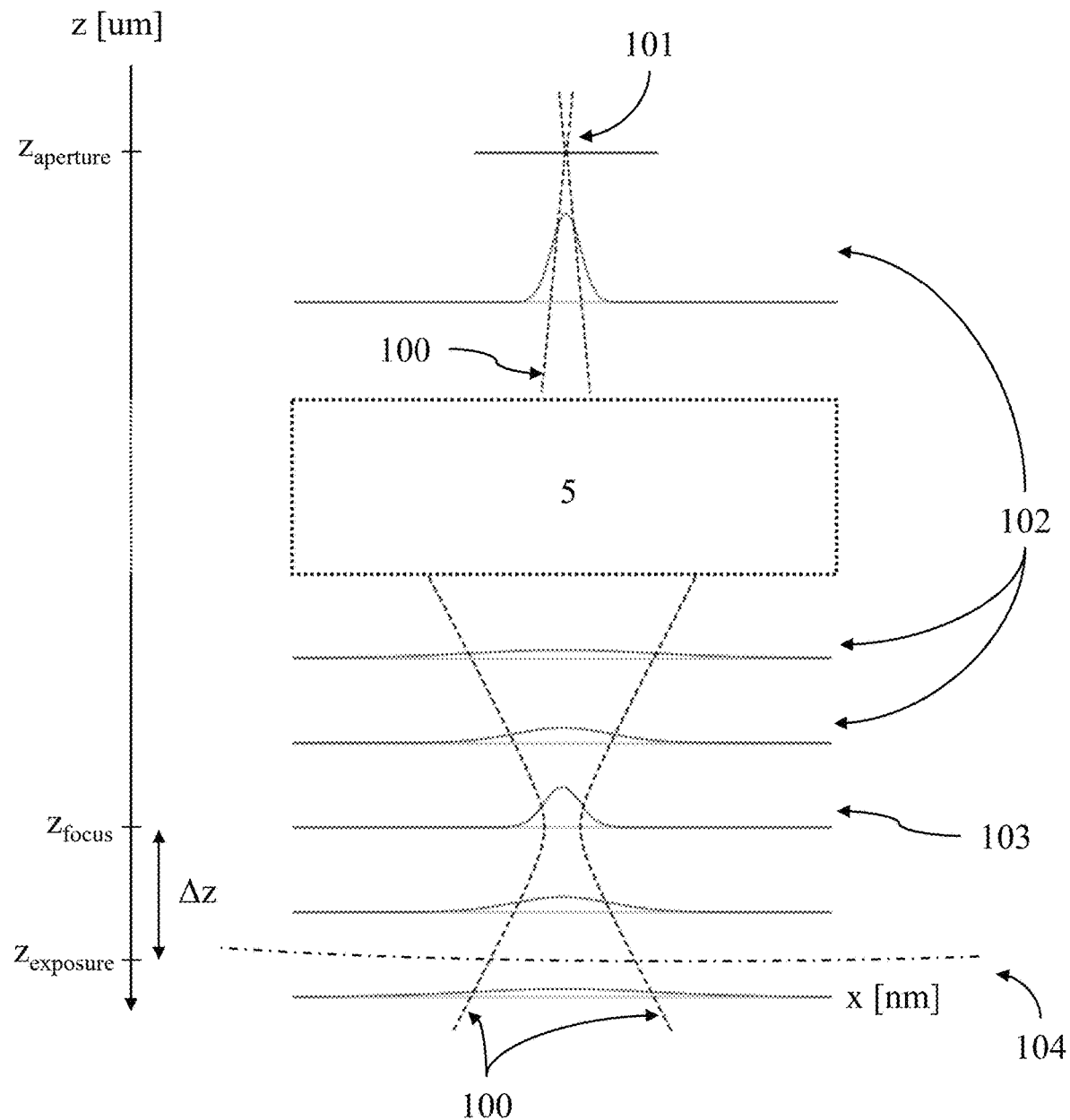
FIG. 8 shows the dependence of the point spread function and associated blur on the Z coordinate.

The main cause of blur inhomogeneity due to elevational distortion is illustrated in FIG. 8 (for one horizontal spatial dimension). The blur of a single beamlet depends on the exposure position in Z direction (that is, the direction of the optical axis cw) relative to the focus of the beamlet. Therefore, a shift in the relative position of substrate and image plane will lead to change of the blur distribution within the beam array field (and the average blur within the image field). In FIG. 8, the current density 102 of a beam 100 passing through an infinitesimal (point-shaped) aperture opening 101 is displayed as a function of the position along the optical axis (i.e., the point spread function as function of X coordinate; several point spread functions are shown for different values of Z coordinate). At the idealized aperture 101, the current density is singular, but due to deviations of the angle of incidence, the current at any other Z position is spread out in perpendicular direction, e.g., following a Gaussian distribution with the 1-sigma level marked with dashed lines 100. The beam is demagnified by the projection system 5 and focused at the position $z_{focus}$, where the spread of the current density 103 (i.e. the beam blur) has a minimum, which is close to zero but not identical to zero (e.g. due to optical aberrations). In the presence of an uneven (i.e., slanted and/or non-plane) mask surface 104, the resist will be exposed to the electron beam at different Z positions $z_{exposure}$ with an offset $\Delta z$ relative to $z_{focus}$, leading to an inhomogeneous point spread function. Furthermore, since $z_{focus}$ generally varies depending on the (perpendicular) position within the pattern definition system 4 (e.g. due to image field curvature), blur within the beam array field is inhomogeneous even on a perfectly flat substrate. Note that for an aperture opening of finite size, the current density at any position z is obtained by convolution of the ideal aperture image with the point spread function.

Furthermore, the invention is not limited to Gaussian point spread functions, and the use of other distributions is easily conceivable. Truncated normal distributions, for instance, may be used in order to take into account the possibility that the electrons travelling with an angle against the Z axis above some threshold typically do not pass through the PD system 4, since they collide with one of the plates 21, 31, or 41 (FIG. 2).

Other Sources of Blur Variation

Elevational distortion is generated not only by uneven mask topology, but can also be induced by disturbances in the illumination or projection optics themselves. Changes in temperature (e.g. due to Joule heating) or barometric air pressure may, for instance, subtly affect the shape of the exposure apparatus 1 and thereby change, e.g., its focal length and hence introduce elevational distortion. Another important cause of blur variation is a change in the total current passing through the illumination optics, for instance, induced by changes in the local pattern density (which determines the fraction of beamlets switched on or off in the pattern definition device). Due to electron-electron interactions at the crossover 11, such current variations can both increase minimal blur (in focus) across the image field (due to random interactions) and shift the image plane by altering the transmission angles at the crossover, generating elevational distortion.

Mathematical Model

In a preferred mathematical model, the blur variation is described as a combination of blur variation due to elevational distortion ("elevational blur") and variation of the minimal blur of a focused beam ("base blur"), which both may vary spatially and temporally. In a suitable simplification of the real behavior, the current distribution (along the plane perpendicular to the optical axis) of a beamlet passing through a point aperture is assumed to obey a two-dimensional normal distribution for any position along the optical axis. That is, the point spread function p of a beamlet (or ensemble of beamlets) exposing a given sub-region with elevation z at a time t is assumed to have the form $$p(z, t) = G(\vec{\mu}, \sum(z, t)),$$

where

-continued $$G(\vec{\mu}, \sum) = \frac{1}{2\pi\sqrt{\det \sum}} \exp\left(-\frac{1}{2}(\vec{r}-\vec{\mu})^T \sum\nolimits^{-1}(\vec{r}-\vec{\mu})\right)$$

is a Gaussian probability density distribution of the position vector $\vec{r}$ with a matrix $\Sigma^{-1}$ given by the inverse matrix of the covariance matrix $$\sum = \begin{pmatrix} \sigma_x^2 & \sigma_x\sigma_y\rho \\ \sigma_x\sigma_y\rho & \sigma_y^2 \end{pmatrix},$$

and mean $$\vec{\mu} = \begin{pmatrix} \mu_x \\ \mu_y \end{pmatrix}.$$

The covariance matrix $\Sigma(z, t)$, which contains variances $$\sum\nolimits_{xx} = \sigma_x^2 \text{ and } \sum\nolimits_{yy} = \sigma_y^2$$

for X and Y directions (referred to as xx- and yy-variances, respectively) in the main diagonal and the covariance $\Sigma_{xy} = \sigma_x\sigma_y\rho$ (where $\rho$ is the correlation coefficient for X and Y directions) as off-diagonal elements, describes the shape and scale of the Gaussian, and is assumed to consist of elevational and base blur components $\Sigma_e$ and $\Sigma_b$, that is, $$\sum(z, t) = \sum\nolimits_e(z, t) + \sum\nolimits_b(t) = \begin{pmatrix} a(z-z_x)^2 & \gamma(z-z_{xy}) \\ \gamma(z-z_{xy}) & \beta(z-z_y)^2 \end{pmatrix} + \begin{pmatrix} b_{xx} & b_{xy} \\ b_{xy} & b_{yy} \end{pmatrix};$$

wherein the parameters are as follows: The xx- and yy-variances of the elevational component $\Sigma_e$ vanish at Z positions $z_x$ and $z_y$ (the blur spot becomes a line), the covariance vanishes at the Z position $z_{xy}$; with the coefficients $\alpha, \beta, \gamma$ describing the two-dimensional 1-sigma cone angle distribution 100. The base blur component $\Sigma_b$ describes additional errors generated, e.g., due to optical aberrations or electron-electron interactions in the beam or column, which are assumed to follow a normal distribution.

In general, the model coefficients $\alpha$, $\beta$, $\gamma$, $z_x$, $z_y$, $z_{xy}$, $b_{xx}$, $b_{yy}$, $b_{xy}$ may be arbitrary functions of time and space (i.e. sub-region position), which could, for instance, be determined by computer simulations. Of particular importance, however, are common shifts of the foci $z_x$, $z_y$, $z_{xy}$ due to beam current, temperature or barometric pressure variations changing the focal length of the exposure apparatus and variations of the base blur coefficients $b_{xx}$, $b_{yy}$, $b_{xy}$ due to random electron-electron interactions within the beam, which increase in intensity proportionally to the current passing through the crossovers c1 and c2 (FIG. 1). In a suitable model, the coefficients are modeled to have a linear, polynomial or cubic spline relationship with the relevant exposure and environment observables (e.g. pressure, temperature, current, pattern density). The environmental observables can easily be measured by suitable sensors located in the exposure apparatus—for instance, a temperature sensor located at the relevant component to be monitored, or a pressure sensor 18a provided at a suitable location of the housing 2—and processed in the processing system 18 of the lithography apparatus 1.

Another important specific functional relationship appears due the observation that often, a sub-region of the exposure area is written by a corresponding specific part of the beam array field (BAF), referred to as "sub-segments". The foci $z_x$, $z_y$, $z_{xy}$ and base blur coefficients $b_{xx}$, $b_{yy}$, $b_{xy}$ in a sub-region depend on the average optical properties (i.e. focus, aberrations) of the beamlets writing said sub-region (in particular on their position within the BAF), which typically repeats periodically over the exposure area, e.g. in the form of stripes whose width is an integer fraction of a BAF width in Y direction when utilizing a scanning strategy with a scanning direction along the X direction, as described in U.S. Pat. No. 9,053,906. To account for this case, the coefficients (or a component of them) for a sub-region of interest may be determined by a procedure which, e.g., comprises: in a first step, (i) determining coefficients (or components thereof) of the desired type for different parts of the BAF (sub-segments), and (ii) determining the sub-segments exposing the sub-region of interest, and in a second step, averaging the BAF-related coefficients obtained in the first step, part (i), over the sub-segments as determined in part (ii) in order to obtain the coefficients for the sub-region of interest.

In favorable embodiments of the invention, the blur dependence on sub-region elevation, image field position and other observables (for instance, the base value of the coefficients $\alpha,\beta,\gamma,z_x,z_y,z_{xy},b_{xx},b_{yy},b_{xy}$ and their functional dependency on said observables) may be determined experimentally by a series of test exposures, where a test pattern is exposed at variety of elevations, beam field positions, exposure and environmental conditions, which may also be simulated, for instance, by employing different values of focus during the respective exposures, introducing changes in barometric pressure, artificially heating parts of the exposure apparatus or varying beam current and/or pattern density of the test patterns.

In an adequate implementation of the invention, a beam and resist model (incorporating electron-resist interactions such as the proximity effect) is used to estimate beam parameters (in particular blur) from measurements of exposed test pattern shapes or dimensions. In a second step, these blur values are used to estimate coefficients or coefficient functions for elevation-dependent blur.

Furthermore it can be suitable to exploit a simplified approach for determining the beam blur, by assuming a linear relationship between the blur in a given direction and the CD of a test pattern measured in this direction (with the slope and offset of said linear function e.g. obtained from simulations). By measuring in multiple directions, the beam shape (i.e. the covariance matrix E for a Gaussian point spread function) can be recovered, e.g., by least-squares fitting.

Generally, the sub-regions may have any shape, but typically, they will have a dimension shorter than the size of the beam field on the target along at least one spatial direction, in order to be able to account for blur variations in the beam field. For instance, the segments may be wider than the whole beam field along the X direction, but are only several beam field rows (i.e. in the order of 100 nm) wide along the Y direction. This implementation may be particularly useful when writing dynamically along the X direction (e.g. as described by the applicant in U.S. Pat. No. 8,222,621), where variation of the above coefficients can only be captured in Y direction (corresponding to the determinable beam-field rows writing a segment, whereas the beam-field columns may be mixed in a non-traceable way). In this case, one suitable choice of exposure area segments would consist of stripes with the same thickness as the beam field segments and a width of one or several beam fields (i.e. in the order of 100 μm) wide in X direction, which is sufficient to capture the elevation variation of the exposure area.

Blur Inhomogeneity Correction

The goal of the invention is to homogenize blur over the whole or part of the exposure area, which part is hereinafter referred to as correction region C, accounting for variation in target elevation, exposure and environmental parameters. In order to obtain a height profile 147 of an exposure area 141, which is a map of Z coordinate values z as function of the X-Y-position, a distance sensor 140 may be used, such as a confocal sensor by Micro-Epsilon Messtechnik (Ortenburg, Germany), as illustrated in FIG. 10. Methods and tools for obtaining a surface metrology of a wafer or other surface are well known in the art, see e.g. U.S. Pat. No. 6,829,054 or US 2013/0128247 A1. In favorable embodiments of the invention, the distance sensor 140 is included in a surface metrology device 19 which is part of the exposure apparatus, as indicated in FIG. 1, to perform in-situ measurements of sub-region elevations.

Figure 11A:
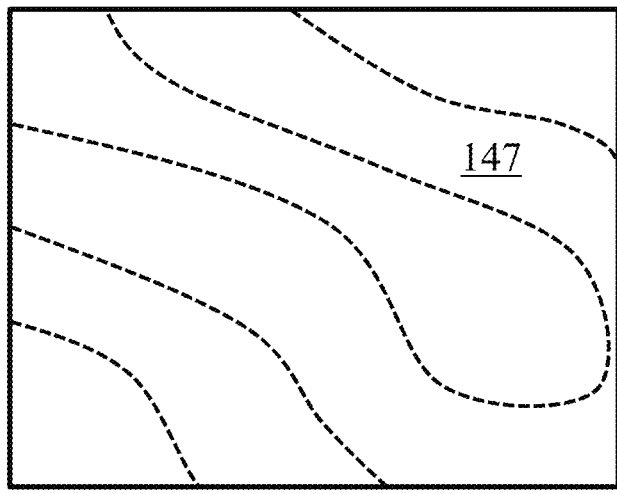
FIGS. 11A-C illustrate the conversion of a map of the elevation, shown in FIG. 11A, into a discrete map of elevation values for a number of segments depicted in FIG. 11B.
Figure 11B:
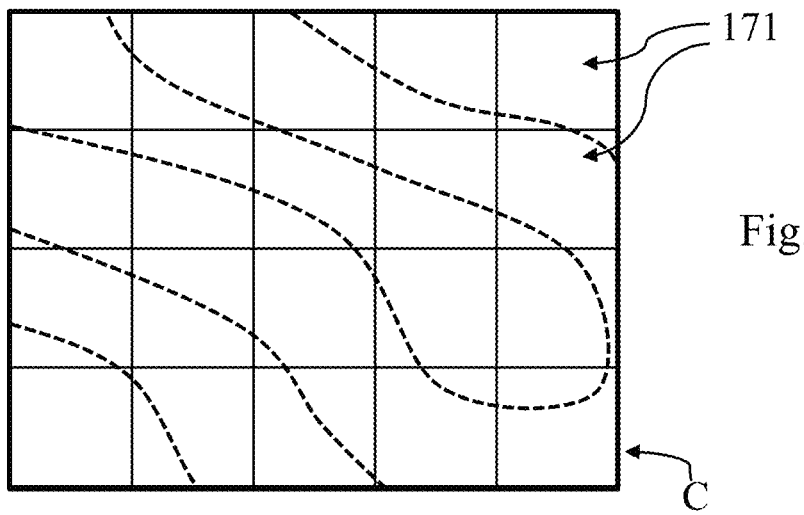
Figure 11C:
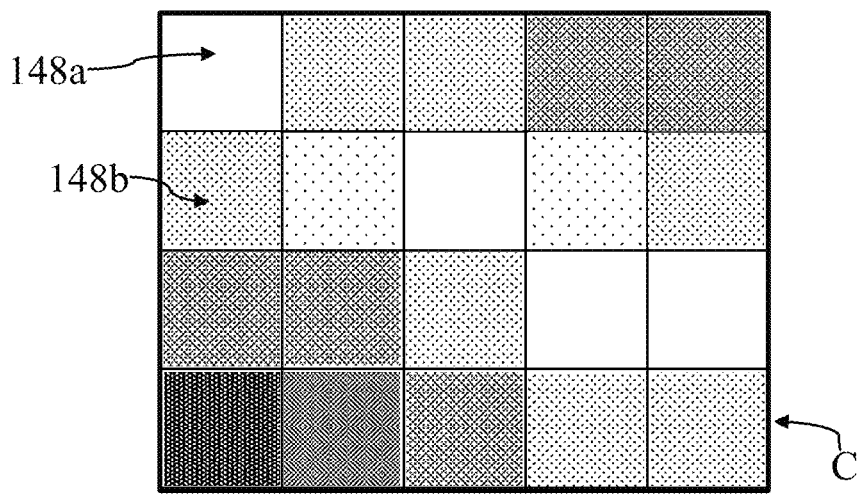

FIG. 11A depicts a schematic example of a height profile 147 of the target surface 141 within the exposure area 170. In order to facilitate processing of the height profile, the exposure area is conceptually split into a plurality of segments 171 (FIG. 11B), and then individual height values may be assigned to respective segments 171, as shown in FIG. 11C, such that every segment 171 is associated with a respective z value 148*a*, 148*b*; in FIG. 11C, different values of the Z coordinate z are indicated as different shades of hatching. The change of the actual value of z inside such a segment 171 is in general small, which justifies that the z value can be assumed to be constant for the whole segment.

In many preferred embodiments of the invention, the exposure is performed with a stripe scanning strategy as described in U.S. Pat. No. 9,053,906 by the applicant, that is, with a series of (possibly overlapping) spatially subsequent stripes. In this case, sub-region elevations can be measured during exposure and the measurements utilized to predict the sub-region elevations of neighboring exposure stripes. Since relevant environmental or exposure parameters are typically stable over the exposure of several stripes (e.g. temperature and pressure) or can be estimated easily (e.g. beam current fluctuations due to variable pattern density), they can be predicted prior to writing a stripe and hence also be incorporated into the blur homogenization model.

Figure 13:
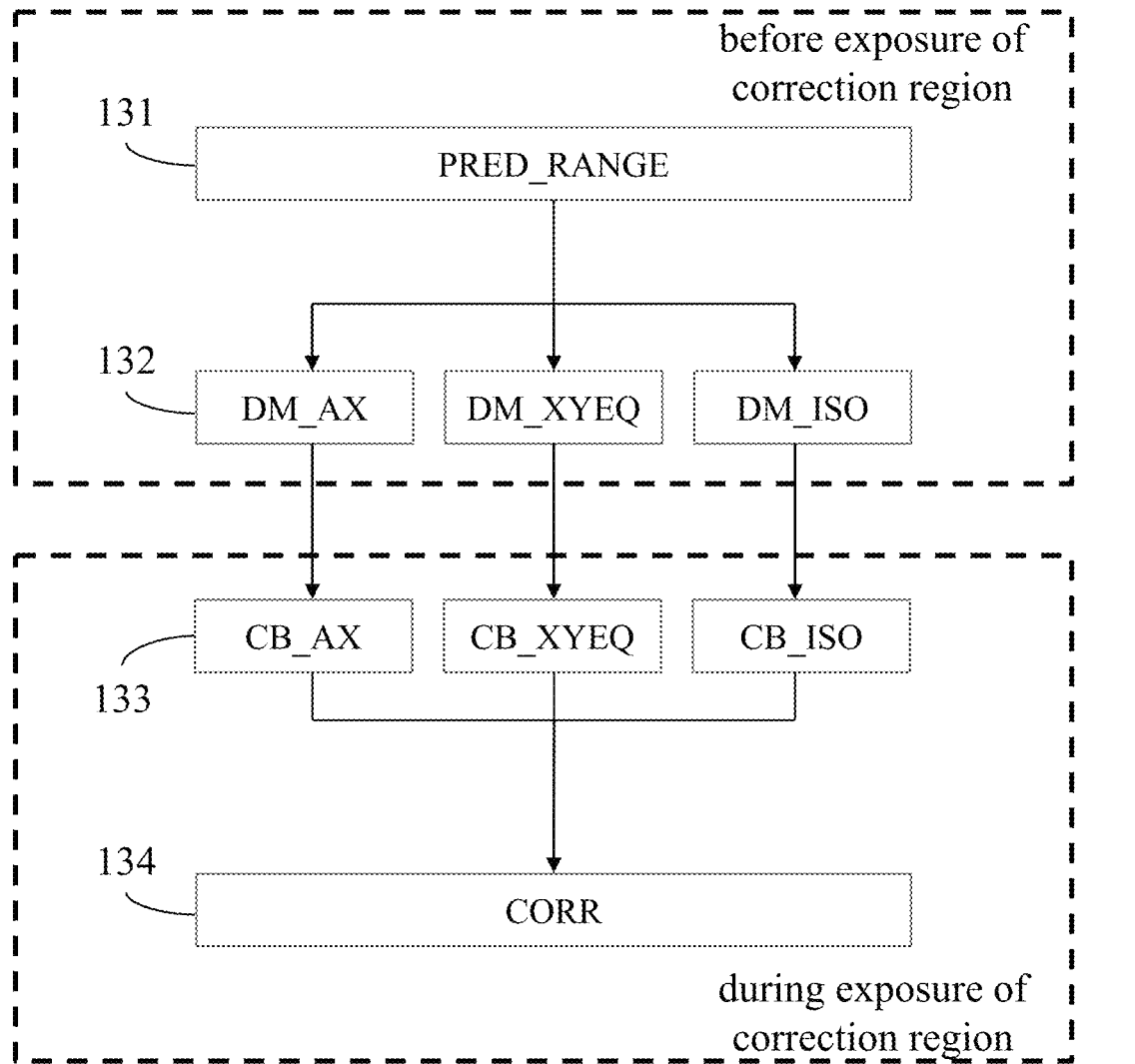
FIG. 13 depicts a flow diagram of the calculation of blur parameters corresponding to the approaches of FIGS. 9A-D.

In one suitable implementation, the correction procedure is performed in several steps, which are depicted as a flowchart in FIG. 13. To homogenize the blur, a first step 131 is predicting the possible range of blur values in the correction region prior to exposure of said correction region (denoted PRED_RANGE). A next step 132 is determining the maximal blur spot in the determined range; the inventors conceived of 3 favorable methods DM_AX, DM_XYEQ and DM_ISO for this step, further explained below, of which one may be selected, or some or all of these methods may run concurrently. In the case of DM_AX, the maximal blur spot comprises two values of maximal blur, namely one for each of the X and Y axes (i.e., the two main axis directions of the nominal target plane 150); in the case of DM_XYEQ and DM_ISO the maximal blur spot comprises only one value (isotropic with respect to the two axes), which then can simply be referred to as 'the' maximal blur. Steps 131 and 132 are performed preferably before start of exposure of the correction region C (this is symbolized by the upper dashed rectangle of FIG. 13). In a third step 133, for every sub-region in the correction region, the correction blur (CB), which artificially increases the estimated physical blur to match the maximal blur in the correction region, is determined, preferably depending on the maximum blur determination method applied earlier, producing respective correction blur values CB_AX, CB_XYEQ, and CB_ISO. A final step 134, denoted CORR, is application of the correction blur, which is preferentially performed via convolution of the rasterized data in the sub-region with a discretized Gaussian filter of adequate scale, as described in U.S. Pat. No. 9,520,268 B2 by the applicant. Preferably, (as symbolized by the lower dashed rectangle of FIG. 13) steps 133 and 134 may be performed on-line, i.e., during exposure of the correction region C (but before exposure of the stripe containing the sub-regions to be corrected).

In steps 131 and 133, a possible range of blur and/or an actually realized physical blur are estimated in the correction region. Preferentially, this estimation is performed using an elevation-blur and base-blur dependent model as described earlier, which may take into account a variety of observable or predictable exposure apparatus characteristics such as sub-region elevation, beam field position of the beamlets writing the sub-region, beam current, temperature and pressure.

A suitable correction region has, for instance, the shape of a single exposure stripe or a shape encompassing multiple exposure stripes (which has a width equal to the size of the beam field in Y direction and extends over the length of the exposure area along the X direction). This choice has the advantage that the variation of relevant observables (in particular elevation variation) which may influence the maximal blur in the correction region can easily be estimated from measured values for nearby stripes, which were exposed prior to the stripes that the correction region comprises. Another suitable choice of correction region is the whole exposure area, which allows for optimal blur and CD homogeneity, but may require less accurate estimates of blur-influencing parameter variation from prior exposures (possibly overestimating the maximal blur) and/or additional measurements prior to exposure.

In a preferred implementation of the invention, shape and dimensions of physical and/or correction blur are described with symmetric covariance matrices containing xx- and yy-variances, and the xy-covariance (denoted by index xy) of a normal distribution representing a Gaussian point spread function corresponding to an ensemble of beamlets exposing the sub-region of interest.

Using this parametrization, the result of step 131 is a set of covariance matrices $\{\Sigma^s\}_{s \in C, e \in E}$, where s denotes a specific sub-region of interest in the correction region C, and E denotes a set of possible environmental conditions e (the environmental condition e is suppressed in the notation $\Sigma^s$ for brevity). The set of covariance matrices is usually finite (e.g. the estimated physical blur covariance matrix for every sub-region s in the correction region), where each instance of the matrix in the set corresponds to a specific value of the sub-region s and environmental condition e. Alternatively, the set may be "infinite" (e.g. a family of covariance matrices, when elevational and environmental variation in the correction region are not known in advance but have to be estimated with intervals); in the case of an "infinite" set, the matrices are described through a dependence of the matrix elements on one or more parameters which may vary within a specified interval, such as a pressure range of ambient pressure p∈ [860 mbar, 1080 mbar] or a temperature range for the temperature of a specific component $T_1 \in$ [15° C., 110° C.]. Such dependence on a parameter may be reflected symbolically, e.g. using interval arithmetic, or through a suitable numeric representation using an interpolation between points supports. For determination of a range of blur value, the blur value is evaluated over the range of the respective parameter, and extremal values are determined, which extremal values are then used as boundary values of the blur range.

In steps 132 and 133, the maximal blur over the correction region is determined, and the blur in the sub-region of interest is incremented by a correction blur such that the combination of sub-region blur and correction blur results in the targeted maximal blur. Mathematically, the combination of Gaussian correction and physical blur is described by summation of the respective covariance matrices, that is, $$T^s = \Sigma^s + Y^s,$$

where $\Sigma^s$ is the covariance matrix of the physical blur (point spread function) in a sub-region s, $Y^s$ is the covariance matrix of the correction blur assigned to the sub-region and $T^s$ is the resulting covariance matrix, which describes the total blur spot. As described above, the total blur spot thus obtained should match the specified maximal blur in the correction region.

Figure 9A:
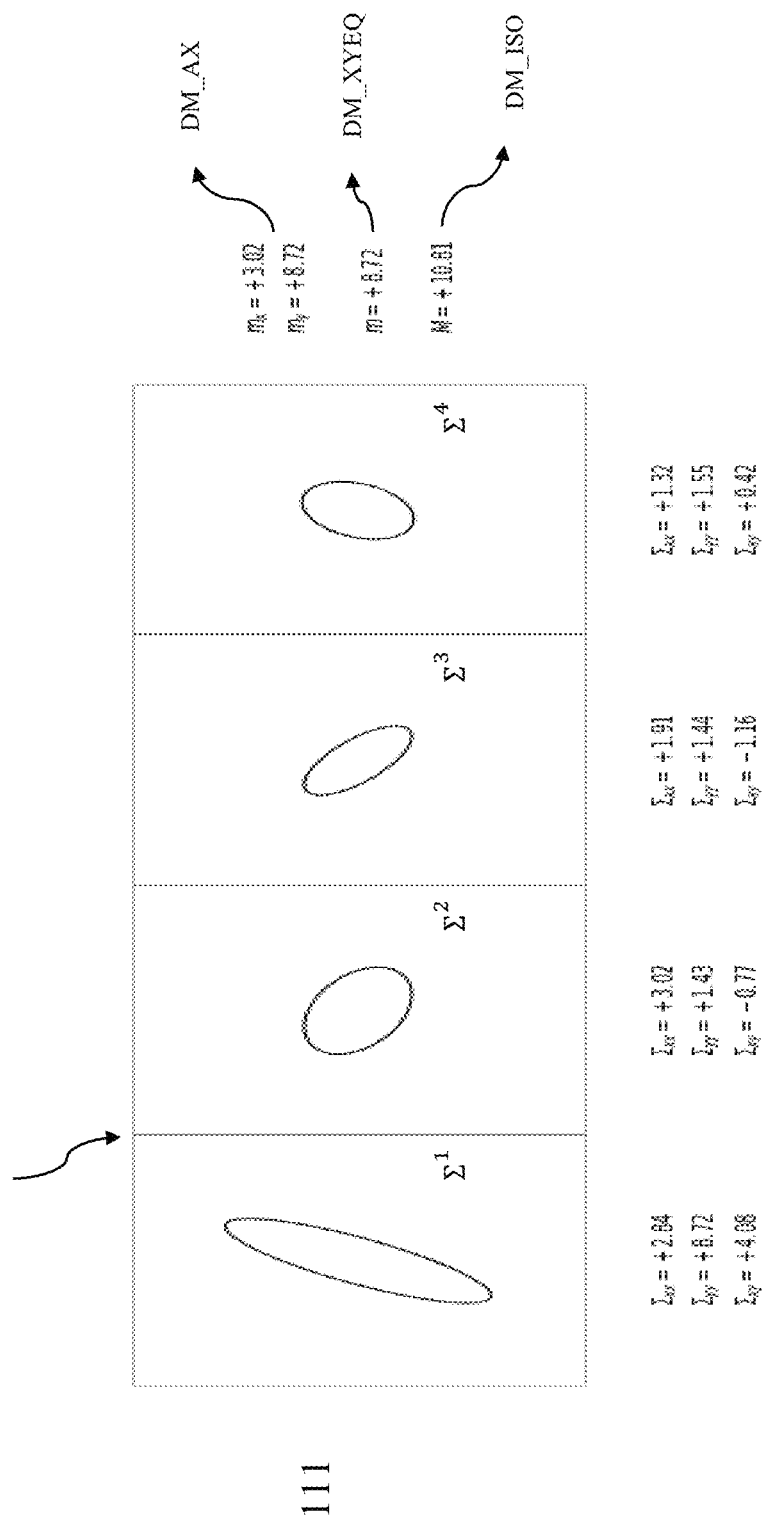
FIGS. 9A-9D illustrate several approaches of implementing parameters for the blur matrices, with the first row depicting an exemplary starting point of given blur, and the second to fourth row illustrating respective approaches for obtaining blur parameters.

To specify the maximal blur and determine the correction blur in step 132, the inventors conceived of several approaches which are illustrated with an example in FIGS. 9A to 9D. FIG. 9A depicts a set of four sub-regions 111, in each of which a 1-sigma level Gaussian point spread function is indicated through an ellipse graph with the underlying parameters printed below. For simplicity, the example is chosen such that the blur spots used in step 132 coincide with those in step 133, i.e., sub-region elevation, exposure and environmental conditions are known before exposure of the correction region; where in practice this condition is not fulfilled, an estimation of the expected location(s) and/or value(s) may be made. In particular, the estimated blur range $\{\Sigma^s\}_{s=1,\ldots,4}$ is a finite set 111 in the example of FIG. 9A, the considerations apply, however, also for an infinite set, where the functional dependence on the respective parameters enters into the respective terms of the calculation.

Figure 9B:
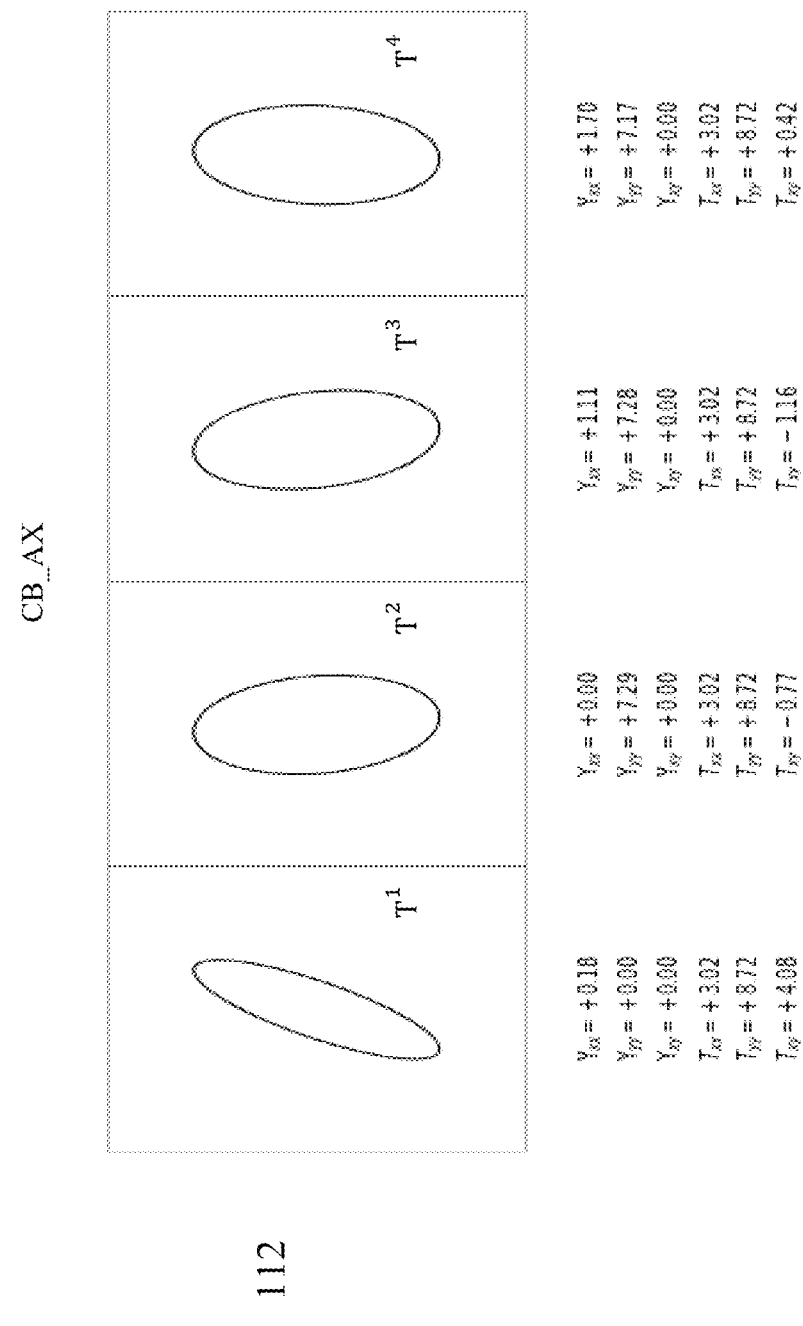
Figure 9C:
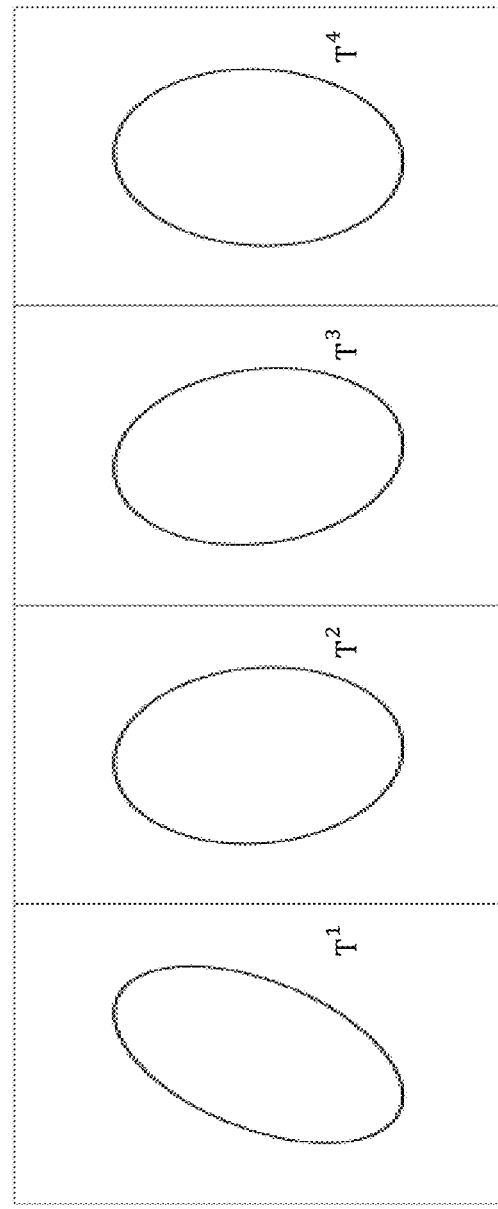

In a first approach (DM_AX, CB_AX in FIG. 13, see FIG. 9B) the maximal blur in X and Y directions is determined and corrected separately for x and y directions:

$$m_x = \max_{s \in C, e \in E} \sum\nolimits_{xx}^s (e)$$

$$m_y = \max_{s \in C, e \in E} \sum\nolimits_{yy}^s (e)$$

wherein the maximum is taken over the estimated blur range, that is, taking into account all sub-regions in the correction region C and a range of possible exposure and environmental conditions E (including a range of sub-region elevation, where the elevation is not known). The corresponding correction blur for each sub-region s $$Y^s = \begin{pmatrix} m_x - \sum\nolimits_{xx}^s & 0 \\ 0 & m_{yy} - \sum\nolimits_{yy}^s \end{pmatrix},$$

is chosen such that the estimated physical blur spots 111 at exposure (with covariance matrices $\Sigma^s$) are homogenized in the correction region 110 (consisting of four sub-regions) for X and Y directions separately. The resulting corrected point spread functions have equal marginal distributions in X and Y directions, but the axial distributions may have different scale and some xy-covariance (correlation) remains, as illustrated in FIG. 9B by the 1-sigma-level sets 112 of corrected blur spots (and the exemplary parameters of correction and total/corrected blur). This approach (DM_AX, CB_AX) can be useful where the main focus of the inhomogeneity correction is with regard to critical dimension uniformity of horizontal and vertical lines, with no special regard for CD differences between horizontal and vertical lines and uniformity of diagonal lines or two-dimensional structures.

In another approach (DM_XYEQ, CB_XYEQ in FIG. 13, see FIG. 9C), the scales of the blur spots 113 for the X and Y directions are equalized as well, but the covariance is not modified and therefore not corrected (that is, the covariance matrix $T^s$ of the corrected blur spots may have a non-zero off-diagonal value $T_{xy}$). This will result in uniform horizontal and vertical lines (but not diagonal lines) and corresponds to the choice:

$$m = \max_{s \in C, e \in E} \left\{ \sum\nolimits_{xx}^{s}(e), \sum\nolimits_{yy}^{s}(e) \right\}$$

$$Y^s = \begin{pmatrix} m_x - \sum\nolimits_{xx}^{s} & 0 \\ 0 & m - \sum\nolimits_{yy}^{s} \end{pmatrix}.$$

Figure 9D:
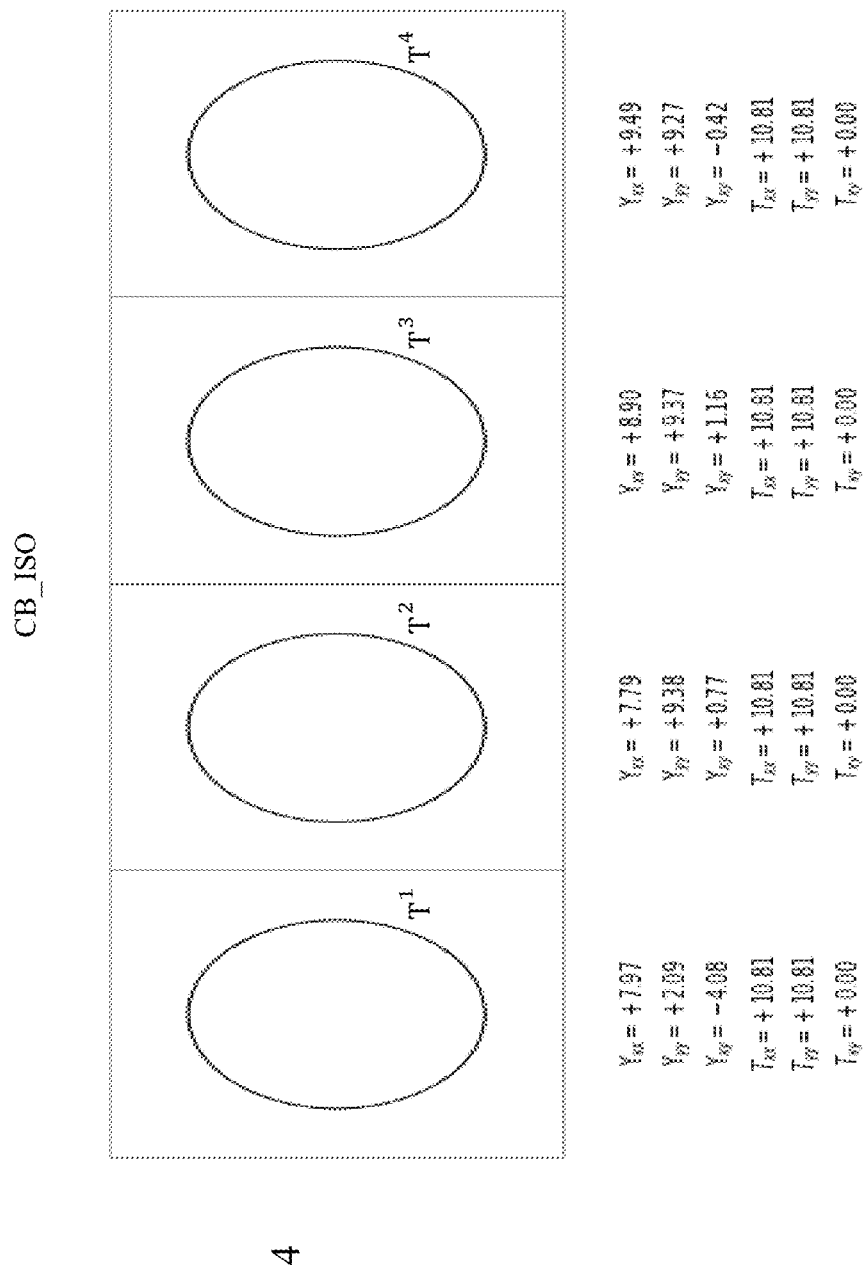

A third approach is illustrated in FIG. 9D. In order to get fully isotropic and uniform point spread functions (and uniformity of arbitrary structures, independent of rotations), the covariance of the correction blur has to compensate for the covariance of the physical blur, and the maximal blur M is determined over all directions in the plane. This approach, denoted by DM_ISO, CB_ISO in FIG. 13, is given by $$M = \max_{s \in C, e \in E} \frac{1}{2}\left( \text{trace}\sum\nolimits^{S}(e) + \sqrt{\left(\text{trace}\sum\nolimits^{s}(e)\right)^2 - 4\det \sum\nolimits^{s}(e)} \right)$$

$$Y^s = \begin{pmatrix} M - \sum\nolimits_{xx}^{s} & -\sum\nolimits_{xy}^{s} \\ -\sum\nolimits_{xy}^{s} & M - \sum\nolimits_{yy}^{s} \end{pmatrix}$$

and results in isotropic and equal blur spots 114.

The application of the estimated correction blur, which is ideally performed in step 134 of the blur homogenization procedure (see FIG. 13), can be performed by artificially increasing the blur in a sub-region via convolution of the rasterized data in the sub-region with a discretized Gaussian filter of adequate scale. In particular, the correction may suitably be applied in the stage 163 of the data path illustrated in FIG. 12. As described in U.S. Pat. No. 9,520,268 B2, the convolution filter may be obtained by evaluating the continuous Gaussian blur at pixel centers (or, alternatively, by integrating it over the pixels).

Figure 14:
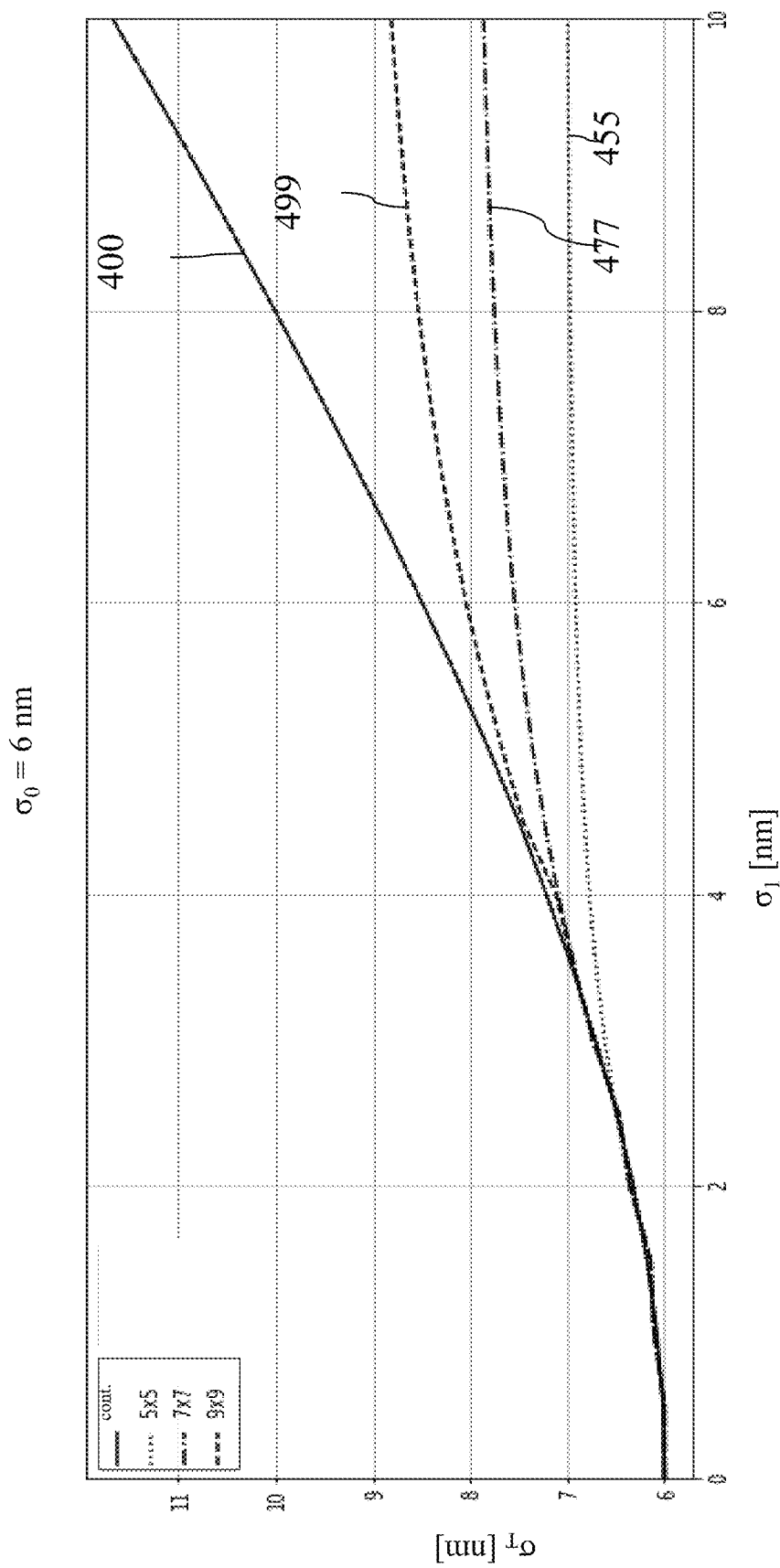
FIG. 14 illustrates the effect of adding an additional blur (i, starting from a fixed initial blur $\sigma_0$ of 6 nm. This additional blur 61 may be a continuous Gaussian blur (solid line) or may be introduced by convolution using matrix-type kernels of various sizes (9×9, 7×7, 5×5 respectively). The axis of ordinate indicates the value of the resulting blur GT.

In relation to another aspect of the invention, it may be instructive to consider the different impact of continuous Gaussian blur and convolution filtering with discretized Gaussian filters which may be applied in the correction blur determination step 133. This is of particular importance if, e.g. for performance reasons, discrete kernels with limited range are utilized. FIG. 14 illustrates this effect on the total blur GT (for isotropic blur) with simulation data, showing the effect of introducing an additional blur 61 of different types to the exposure system (solid line) with an initial blur $\sigma_0 = 6$ nm, where the additional blur 61 may have varying size (abscissa value) and is one of four exemplary types as indicated respectively by the lines 400, 499, 477, 455, namely: full line 400 represents the combination with a continuous Gaussian blur; dashed line 499 represents convolution of the pixel data with a 9×9 truncated Gaussian kernel; dot-dashed line 477 represents convolution of the pixel data with a 7×7 truncated Gaussian kernel; and dotted line 455 likewise with a 5×5 truncated Gaussian kernel. This will combine into a total blur GT (ordinate value) as a function of the additional blur 61 as depicted by the respective line 400, 499, 477, 455. As an example, in order to achieve a target blur $\sigma_1$ of 8.5 nm an extra 6 nm Gaussian blur has to be applied (root square sum), for a similar exposure profile and CD, however, a 9×9 truncated Gaussian kernel with $\sigma = 8$ nm has to be used. One simple way to determine the effect of discrete Gaussian kernels (obtaining, e.g., multiple curves as in FIG. 14 for the expected range of tool blur) is by exposure of test structures (e.g. lines of various orientations) at different focus levels, with multiple convolution kernels generated from covariance matrices in the expected range prior to exposure. During exposure, the convolution kernels are then generated using correction blur values whose effects best match that of the target blur. Evidently, the target blur may be anisotropic or isotropic, as described earlier.

What is claimed is:

1. A method for computing an exposure pattern for exposing a desired pattern on a target in a charged-particle multi-beam processing apparatus, in which a particle beam is directed to and illuminates a pattern definition device comprising an aperture array composed of a plurality of blanking apertures through which said particle beam penetrates for writing said desired pattern by exposing a multitude of pixels within an exposure area on the target by means of said particle beam impinging on the target according to a nominal beam direction, the target being oriented along a nominal target plane substantially perpendicular to said nominal beam direction, wherein a writing process for writing said desired pattern comprises imaging of the blanking apertures onto the target in each of a sequence of exposure intervals, thus generating a corresponding plurality of aperture images, wherein said imaging of blanking apertures onto the target involves a blur, the method taking into account an elevation of the target within the exposure area relative to the nominal target plane, as well as a dependence of the blur upon such elevation of the target according to an elevation dependence function, wherein the desired pattern is provided as a graphical representation composed of a multitude of image elements in a correspondence to said multitude of pixels in the exposure area on the target, wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval, the method comprising:
(i) measuring an elevation of the target at a reference point within the exposure area, said elevation representing a local shift of the target from the nominal target plane at the location of said reference point, (ii) determining, based on said elevation dependence function, a local blur value, said local blur value representing the actual value of blur corresponding to the elevation of the target determined in the previous step, (iii) determining, based on said local blur value and a given target blur level, an additional correction blur value and calculating a convolution kernel using said correction blur value, said kernel describing a mapping from an image element of the graphical representation to a group of pixels, said group of pixels being centered around a nominal position of said image element, wherein said kernel represents a point spreading function realizing said correction blur value, and (iv) calculating a nominal exposure pattern as a pixel raster graphics defined on the multitude of pixels, by convolution of the graphical representation with the convolution kernel in at least a region of the exposure area which includes said reference point, said nominal exposure pattern being suitable to create a nominal dose distribution on the target;

wherein the convolution calculated in step (iv) corresponds to introducing said correction blur into the nominal exposure pattern, said correction blur increasing the blur of the exposure pattern from the local blur value to said target blur value.

2. The method of claim 1, wherein the method takes into account a spatial variation of the elevation of the target within the exposure area relative to the nominal target plane, the method employing a partitioning of the exposure area into a plurality of non-overlapping sub regions, wherein steps (i) to (iv) are done for each of said sub-regions, wherein in step (i) for each of said sub-regions a respective elevation of the target in a respective reference point of the sub-region is calculated, and steps (ii) to (iv) are done using a respective local blur value, and the target blur value is chosen as a value not below the maximum over the set of local blur values among all sub-regions.

3. The method of claim 2, wherein the sub regions are realized as parallel stripes, each stripe having a longer side which is oriented substantially parallel to a general writing direction, said general writing direction representing a direction of lines along which subsequent exposures of pixels are performed during an exposure process in said charged-particle apparatus.

4. The method of claim 3, wherein the longer side of the stripes extends over a width of the particle beam where it impinges on the target, as measured along said general writing direction.

5. The method of claim 2, wherein the aperture array of the pattern definition device is imaged to the target producing a beam array field, and wherein at least some of the sub regions have a width smaller than a width of the image of the aperture array as imaged onto the target, said widths being measured across the general writing direction.

6. The method of claim 5, wherein the width of said sub regions is the distance of aperture images on the target along a direction transversal to the general writing direction.

7. The method of claim 2, wherein calculation of blur is performed with respect to the two main axes of the nominal target plane, thus obtaining target blur values for each of said two main axes, by choosing, for each main axis, a target blur value as a value not below the maximum over the set of local blur values along the respective main axis among all sub-regions.

8. The method of claim 7, wherein an anisotropic kernel is calculated which corresponds to introducing a correction blur value increasing the blur of the exposure pattern from the local blur value to the target blur value for each of the two main axes separately.

9. The method of claim 7, wherein an anisotropic kernel is calculated which corresponds to introducing a correction blur value increasing the blur of the exposure pattern from the local blur value to the greater value of the two target blur values for the two main axes.

10. The method of claim 9, wherein an anisotropic kernel is calculated which contains correction components which enable correction of the blur of the exposure pattern to an isotropic blur.

11. The method of claim 10, wherein said correction components in the anisotropic kernel include off-diagonal correction components.

12. The method of claim 2, where the effect of a set of candidate convolution kernels on the total blur of the exposure system is determined by: exposing test structures with said candidate convolution kernels, wherein said candidate convolution kernels are associated with different kernel blur values, respectively, which extend over a predetermined value range; estimating the total blur from measurements of said test structures; and choosing in step (iii) a kernel blur value from the value range such that the total blur of the exposure system matches the target blur.

13. The method of claim 1, wherein the kernel describes the blur as a discretized realization of a two-dimensional Gaussian function.

14. The method of claim 1, wherein the kernel corresponds to an additional correction blur which is a sum including an elevation-dependent blur and a base blur, where the base blur is calculated as a function of the pattern density around the respective reference point.

15. The method of claim 1, wherein the kernel corresponds to an additional correction blur which is a blur determined based on one or more environmental parameter of the processing apparatus, said environmental parameters including barometric pressure, temperatures of specific components of said processing apparatus, temperature at the location of the target, actual beam current of the particle beam.

16. The method of claim 1, the method further comprising providing a particle beam, directing the particle beam to a pattern definition device comprising an aperture array composed of a plurality of blanking apertures through which said particle beam penetrates, thus forming a patterned beam consisting of a corresponding plurality of beamlets in accordance with said exposure pattern, directing the patterned beam exiting from the pattern definition device towards an exposure area on the target for writing said desired pattern by exposing a multitude of pixels within said exposure area.

17. The method of claim 14, wherein the elevation of at least one reference point on the target is determined by means of a surface metrology device provided in said charged-particle multi-beam processing apparatus.

18. A method for computing an exposure pattern for exposing a desired pattern on a target in a charged-particle multi-beam processing apparatus, in which a particle beam is directed to and illuminates a pattern definition device comprising an aperture array composed of a plurality of blanking apertures through which said particle beam penetrates for writing said desired pattern by exposing a multitude of pixels within an exposure area on the target by means of said particle beam impinging on the target according to a nominal beam direction, the target being oriented along a nominal target plane substantially perpendicular to said nominal beam direction,
  wherein a writing process for writing said desired pattern comprises imaging of the blanking apertures onto the target in each of a sequence of exposure intervals, thus generating a corresponding plurality of aperture images, wherein said imaging of blanking apertures onto the target involves a blur,
  the method taking into account an elevation of the target within the exposure area relative to the nominal target plane, as well as a dependence of the blur upon such elevation of the target according to an elevation dependence function,
  wherein the desired pattern is provided as a graphical representation composed of a multitude of image elements in a correspondence to said multitude of pixels in the exposure area on the target,
  wherein in the pattern definition device said plurality of blanking apertures is arranged in a predetermined arrangement defining mutual positions of the blanking apertures, each blanking aperture being selectively adjustable with regard to a dose value to be exposed through the respective blanking aperture onto a corresponding aperture image generated on the target during a respective exposure interval,
  the method comprising:
  (i) measuring an elevation of the target at a reference point within the exposure area, said elevation representing a local shift of the target from the nominal target plane at the location of said reference point, and also determining a value of pattern density around said reference point,
  (ii) determining, based on said elevation dependence function, a local blur value, said local blur value representing the actual value of blur corresponding to the elevation of the target determined in the previous step, plus an additional blur calculated as a function of the pattern density around the respective reference point,
  (iii) determining, based on said local blur value and a given target blur level, an additional correction blur value and calculating a convolution kernel using said correction blur value, said kernel describing a mapping from an image element of the graphical representation to a group of pixels, said group of pixels being centered around a nominal position of said image element, wherein said kernel represents a point spreading function realizing said correction blur value, and
  (iv) calculating a nominal exposure pattern as a pixel raster graphics defined on the multitude of pixels, by convolution of the graphical representation with the convolution kernel in at least a region of the exposure area which includes said reference point, said nominal exposure pattern being suitable to create a nominal dose distribution on the target;
  wherein the convolution calculated in step (iv) corresponds to introducing said correction blur into the nominal exposure pattern, said correction blur increasing the blur of the exposure pattern from the local blur value to said target blur value.

19. The method of claim 1, wherein measuring the elevation of the target at the reference point within the exposure area is performed with a distance sensor.

20. The method of claim 18, wherein measuring the elevation of the target at a reference point within the exposure area is performed with a distance sensor.

* * * * *